United States Patent
Kim et al.

(12)

(10) Patent No.: US 10,468,498 B2
(45) Date of Patent: Nov. 5, 2019

(54) VERTICAL FIN BIPOLAR JUNCTION TRANSISTOR WITH HIGH GERMANIUM CONTENT SILICON GERMANIUM BASE

(71) Applicant: INTERNATIONAL BUSINESS MACHINES CORPORATION, Armonk, NY (US)

(72) Inventors: Seyoung Kim, White Plains, NY (US); Choonghyun Lee, Rensselaer, NY (US); Injo Ok, Loudonville, NY (US); Soon-Cheon Seo, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/100,317

(22) Filed: Aug. 10, 2018

(65) Prior Publication Data
US 2019/0165128 A1    May 30, 2019

Related U.S. Application Data

(62) Division of application No. 15/826,001, filed on Nov. 29, 2017, now Pat. No. 10,115,800.

(51) Int. Cl.
*H01L 29/66* (2006.01)
*H01L 21/306* (2006.01)
(Continued)

(52) U.S. Cl.
CPC .... *H01L 29/66242* (2013.01); *H01L 21/0228* (2013.01); *H01L 21/02112* (2013.01);
(Continued)

(58) Field of Classification Search
CPC .......... H01L 29/66242; H01L 29/7378; H01L 21/02532; H01L 29/7371;
(Continued)

(56) References Cited

U.S. PATENT DOCUMENTS 9,496,341 B1 * 11/2016 Cheng ................ H01L 29/1054
9,520,469 B1    12/2016 Balakrishnan et al.
(Continued)

OTHER PUBLICATIONS

Co-pending U.S. Appl. No. 15/826,001.

*Primary Examiner* — Ngan V Ngo
(74) *Attorney, Agent, or Firm* — F. Chau & Associates, LLC

(57) ABSTRACT

A method of manufacturing a bipolar junction transistor (BJT) structure is provided. Pattern etching through a second semiconductor layer and recessing a silicon germanium layer are performed to form a plurality of vertical fins each including a silicon germanium pattern, a second semiconductor pattern and a hard mask pattern sequentially stacked on a first semiconductor layer above a substrate. First spacers are formed on sidewalls of the plurality of vertical fins. Exposed silicon germanium layer above the first semiconductor layer is directionally etched away. A germanium oxide layer is conformally coated to cover all exposed top and sidewall surfaces. Condensation annealing followed by silicon oxide strip is performed. The first spacers, remaining germanium oxide layer and the hard mask pattern are removed. A dielectric material is deposited to isolate the plurality of vertical fins. An emitter, a base and a collector contacts are formed to connect to the second semiconductor pattern, the silicon germanium pattern and the first semiconductor layer, respectively. The BJT structures manufactured are also provided.

8 Claims, 14 Drawing Sheets

(51) Int. Cl.
- *H01L 21/308* (2006.01)
- *H01L 21/324* (2006.01)
- *H01L 29/165* (2006.01)
- *H01L 21/02* (2006.01)
- *H01L 29/737* (2006.01)
- *H01L 29/10* (2006.01)
- *H01L 29/732* (2006.01)
- *H01L 29/417* (2006.01)
- *H01L 21/423* (2006.01)
- *H01L 29/06* (2006.01)
- *H01L 29/08* (2006.01)
- *H01L 29/423* (2006.01)

(52) U.S. Cl.
CPC ...... *H01L 21/02532* (2013.01); *H01L 21/308* (2013.01); *H01L 21/30604* (2013.01); *H01L 21/324* (2013.01); *H01L 29/0684* (2013.01); *H01L 29/0817* (2013.01); *H01L 29/1004* (2013.01); *H01L 29/165* (2013.01); *H01L 29/41708* (2013.01); *H01L 29/42304* (2013.01); *H01L 29/732* (2013.01); *H01L 29/737* (2013.01); *H01L 29/7371* (2013.01); *H01L 29/7378* (2013.01); *H01L 29/66272* (2013.01); *H01L 2924/1305* (2013.01)

(58) Field of Classification Search
CPC .......... H01L 2924/1305; H01L 29/732; H01L 29/0817; H01L 29/737
See application file for complete search history.

(56) References Cited

U.S. PATENT DOCUMENTS

| | | |
|---|---|---|
| 9,614,086 B1* | 4/2017 | Yeo ............... H01L 23/535 |
| 2004/0031979 A1 | 2/2004 | Lochtefeld et al. |
| 2015/0200128 A1 | 7/2015 | Jacob et al. |
| 2015/0228648 A1* | 8/2015 | Chi ............... H01L 27/0886 |
| | | 257/401 |
| 2015/0263091 A1 | 9/2015 | Hashemi et al. |
| 2016/0211381 A1 | 7/2016 | Kurokawa |
| 2016/0336055 A1 | 11/2016 | Kato |
| 2017/0033109 A1 | 2/2017 | Yamazaki |
| 2017/0179284 A1 | 6/2017 | Kim et al. |
| 2017/0229465 A1* | 8/2017 | Luan ............... H01L 21/28518 |
| 2017/0288056 A1* | 10/2017 | Balakrishnan ...... H01L 29/7827 |
| 2018/0026101 A1 | 1/2018 | Jagannathan et al. |

* cited by examiner

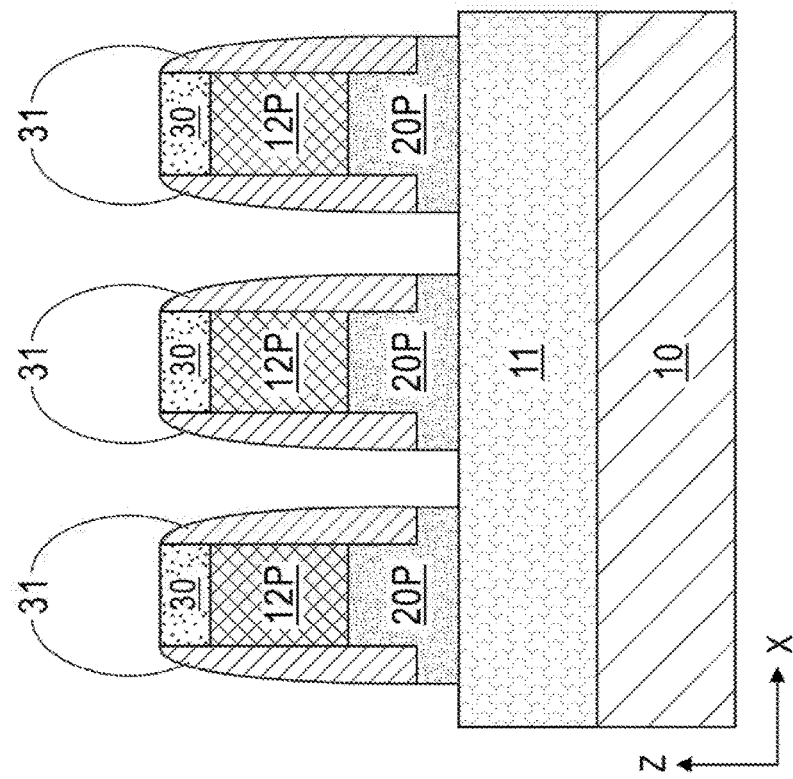
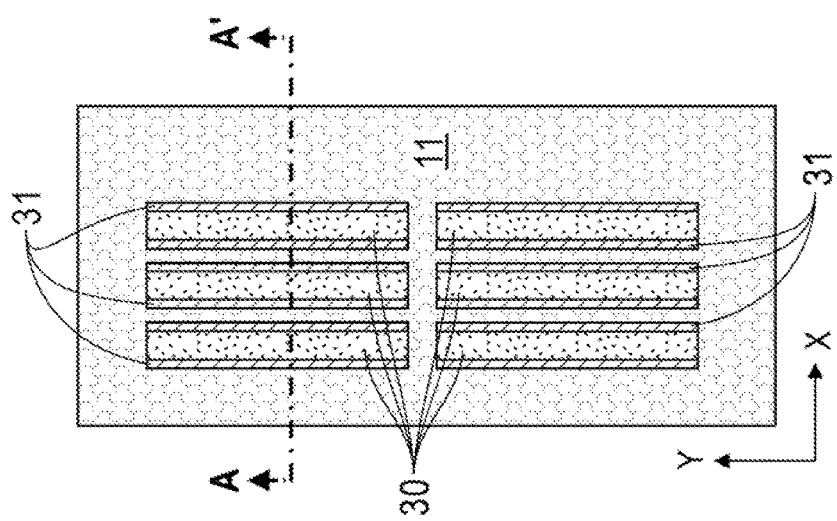
FIG. 5B
FIG. 5A

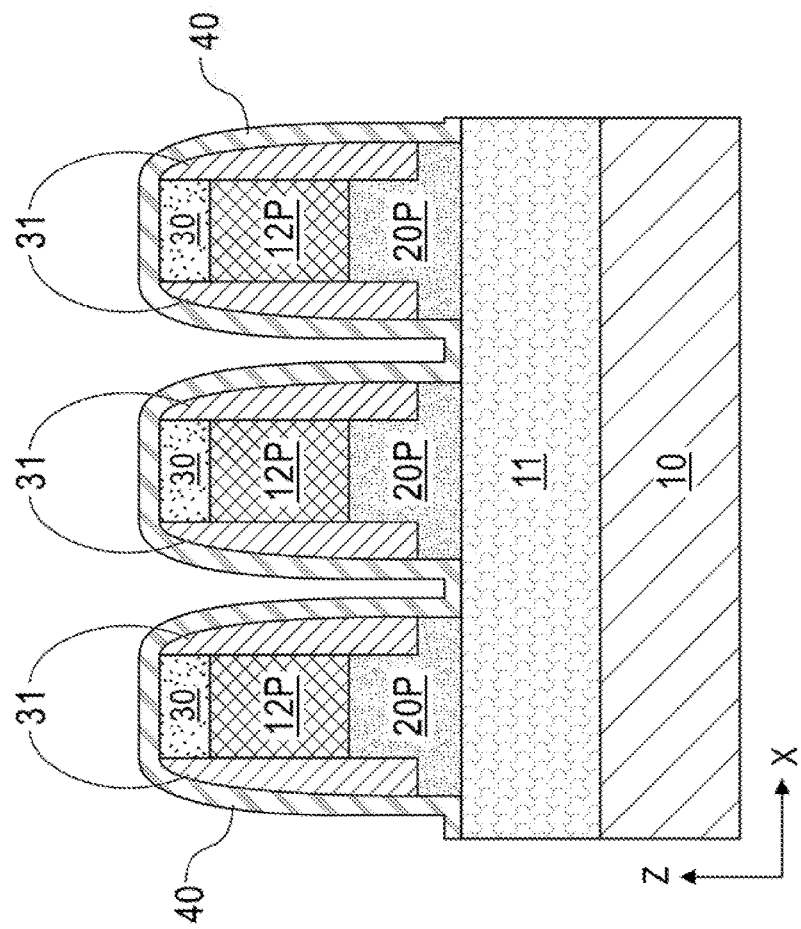
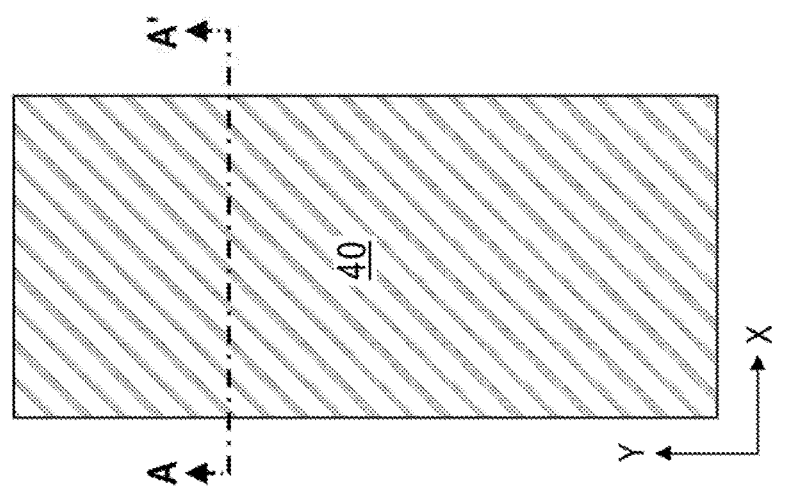
FIG. 6B
FIG. 6A

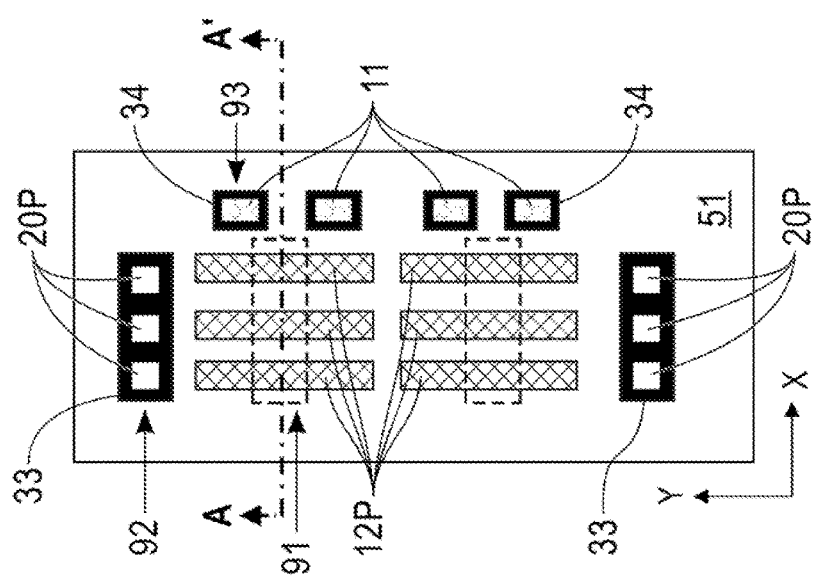
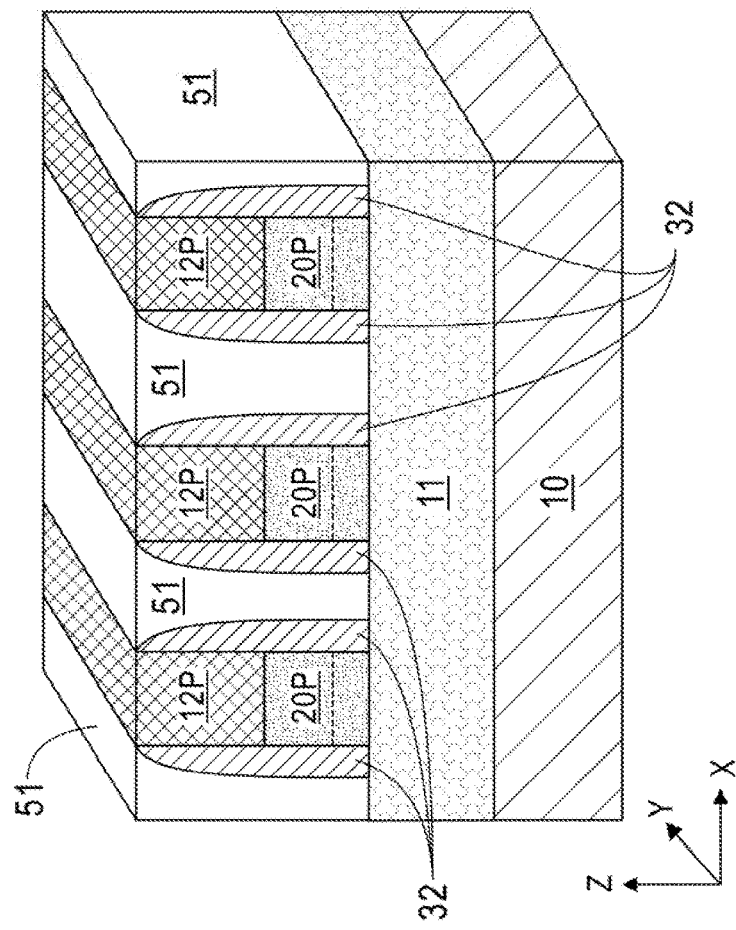
FIG. 12B
FIG. 12A

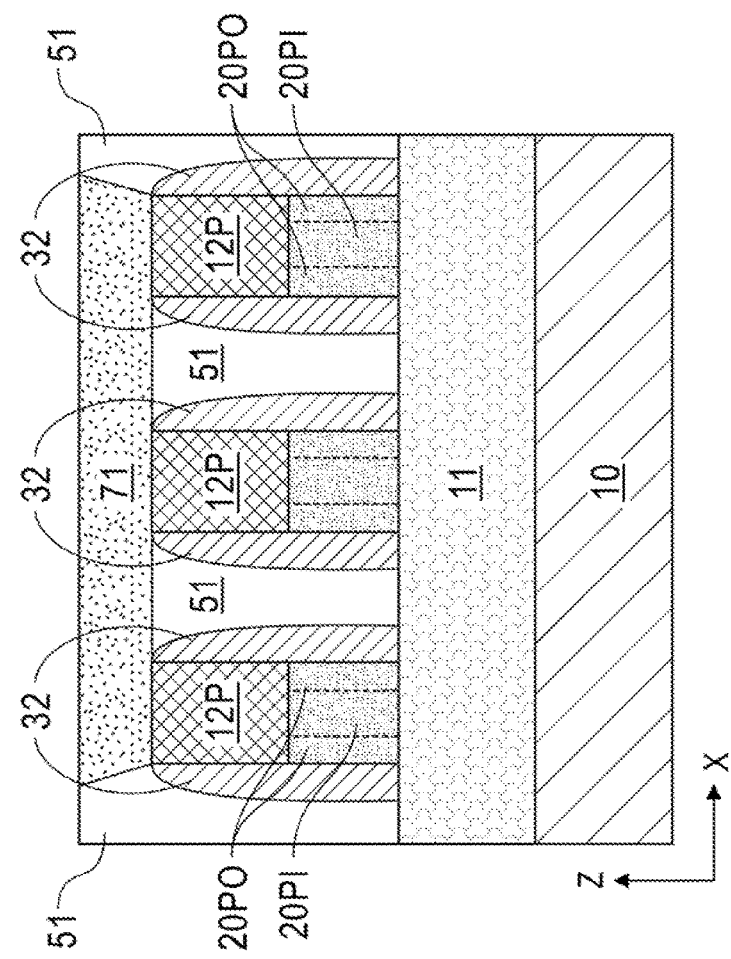
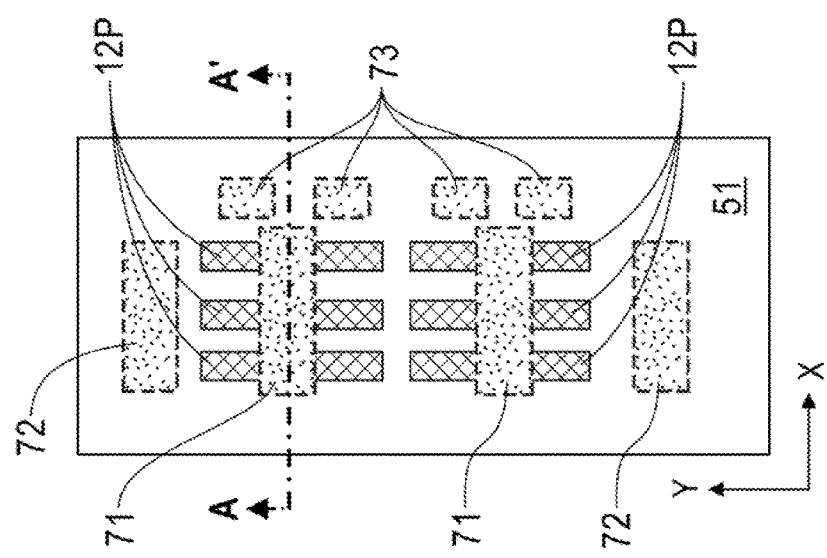
FIG. 14A
FIG. 14B

VERTICAL FIN BIPOLAR JUNCTION TRANSISTOR WITH HIGH GERMANIUM CONTENT SILICON GERMANIUM BASE

CROSS-REFERENCE TO RELATED APPLICATIONS

This application is a divisional of and claims priority to U.S. application Ser. No. 15/826,001 filed on Nov. 29, 2017, the entire contents of which are incorporated by reference herein.

FIELD OF THE INVENTION

The present invention relates generally to a method of manufacturing a bipolar junction transistor (BJT) structure and the BJT structure manufactured, and more particularly to a method of manufacturing a vertical fin BJT structure with silicon germanium (SiGe) base having high germanium content, and the vertical fin BJT structure manufactured.

BACKGROUND OF THE INVENTION

A bipolar junction transistor (BJT) uses both electron and hole charge carriers. The BJT may be manufactured in two types, NPN and PNP, and may be used as, for example, an amplifier or a switch for variety of electronic devices. An NPN BJT includes two regions of n-type semiconductor material constituting the emitter and collector regions, and a region of p-type semiconductor material located between the two regions of n-type semiconductor material constituting the base region. A PNP BJT consists one region of N-type semiconductor material between two regions of P-type semiconductor material. A heterojunction bipolar transistor (HBT) is a type of BJT which uses differing semiconductor materials for the emitter and base regions, creating a heterojunction, and may operate based on a bandgap difference between the emitter and the base. For example, the emitter may include silicon, and the base may include silicon germanium (SiGe). The SiGe HBT may be superior than the conventional silicon BJTs in many aspects including, for example, reduction in base-transit time resulting in higher frequency performance, an increase in collector current density and hence higher current gain, and an increase in early voltage at a particular cutoff frequency.

The structure or composition of the SiGe base may be tailored to further enhance the performance of the SiGe HBT. For example, the base transit time can be further reduced by building into the base a drift field that aids the flow of electrons from the emitter to the collector. There are two ways of accomplishing this. The classical method is to use graded base doping, i.e., a large doping concentration near the emitter-base (EB) junction, which gradually decreases toward the collector-base (CB) junction. The other approach is to have the energy gap of the base decreasing from the emitter end to the collector end. In other words, the germanium (Ge) content of the SiGe in the base of the HBT is higher on the collector side. There are many technical challenges in forming the base with graded Ge content with high Ge content at the CB junction. For example, high Ge content strained SiGe cannot be epitaxially grown on Si without defects. In other words, the SiGe layer with a certain amount of Ge content may require a thickness higher than a certain thickness for the device to function well, however, this required thickness may be higher than the critical thickness that the defect free SiGe layer with this Ge content may be epitaxially grown. To alleviate this problem, a conventional Ge condensation on silicon on insulator (SOI) process may be used to increase the Ge content in the SiGe layer. The conventional Ge condensation process may require high temperature. The high temperature (>950° C.) oxidation process required may not be compatible with the Si/SiGe dual channel complementary metal-oxide-semiconductor (CMOS) device. In addition, Ge out diffusion cannot be controlled at this high temperature. As such, there is a need for providing a method in which a BJT structure with SiGe base having high Ge content can be fabricated without being subjected to the high temperature Ge condensation process.

SUMMARY OF THE INVENTION

According to an aspect of the present invention, there is provided a method of manufacturing a bipolar junction transistor (BJT) structure including: providing a substrate having a first semiconductor layer, a silicon germanium layer and a second semiconductor layer sequentially stacked on the substrate; pattern etching through the second semiconductor layer and recessing the silicon germanium layer to form a plurality of vertical fins spaced apart in a first direction and extending in a second direction crossing the first direction, each of the plurality of vertical fins including a silicon germanium pattern, a second semiconductor pattern and a hard mask pattern sequentially stacked on the first semiconductor layer; forming first spacers on sidewalls of the plurality of vertical fins; directionally etching away exposed silicon germanium layer above the first semiconductor layer; depositing a germanium oxide layer to conformally coat exposed top and sidewall surfaces of the plurality of vertical fins and the first semiconductor layer; performing condensation annealing followed by silicon oxide strip; removing the first spacers, remaining germanium oxide layer and the hard mask pattern of each of the plurality of vertical fins; depositing a dielectric material over the first semiconductor layer to fill all spaces among the plurality of vertical fins; and forming an emitter contact, a base contact and a collector contact connected to the second semiconductor pattern, the silicon germanium pattern and the first semiconductor layer, respectively, in the dielectric material.

In the method of manufacturing the semiconductor structure, the depositing of the germanium oxide layer and the performing of the condensation annealing followed by silicon oxide strip may be repeated sequentially two or more times. The recessing of the silicon germanium layer may include recessing from about 20% to about 80% of a thickness of the silicon germanium layer. The silicon germanium layer may include silicon germanium ($Si_{1-x}Ge_x$) with a germanium mole fraction x in a range from about 0.03 to about 0.2. After the performing of the condensation annealing, a germanium mole fraction x of $Si_{1-x}Ge_x$ included in a lower portion of the silicon germanium pattern near the first semiconductor layer may be larger than that of $Si_{1-x}Ge_x$ included in an upper portion of the silicon germanium pattern near the second semiconductor pattern. Before the depositing of the dielectric material, the method may further include selectively removing a portion of the second semiconductor pattern above the silicon germanium pattern for forming the base contact in a subsequent step. Before the depositing of the dielectric material, the method may further include forming second spacers on sidewalls of the plurality of vertical fins, in which the second spacers may include a material the same as that of the first spacers. The first and second semiconductor layers may each individually include an n-doped semiconductor and the silicon germanium layer may include p-doped silicon germanium, or the first and second semiconductor layers may each individually include a p-doped semiconductor and the silicon germanium layer may include n-doped silicon germanium. The first and second semiconductor layers may be formed of silicon. The performing of the condensation annealing may be performed under nitrogen at a temperature in a range from about 500° C. to about 700° C. A thickness of the germanium oxide layer deposited may be in a range from about 1 nm to about 10 nm. The depositing of the germanium oxide layer may be carried out with atomic layer deposition (ALD) process.

According to another aspect of the present invention, there is provided a BJT structure including: a first semiconductor layer disposed on a substrate; a plurality of vertical fins disposed on the first semiconductor layer, spaced apart in a first direction and extending in a second direction crossing the first direction, each of the plurality of vertical fins vertically protruding in a third direction perpendicular to the first and second directions, and including a silicon germanium pattern and a second semiconductor pattern sequentially stacked on the first semiconductor layer; a dielectric material formed over the first semiconductor layer to fill all spaces among the plurality of vertical fins; and an emitter contact, a base contact and a collector contact formed within the dielectric material to connect to the second semiconductor pattern, the silicon germanium pattern and the first semiconductor layer, respectively, in which a germanium mole fraction x of silicon germanium ($Si_{1-x}Ge_x$) included in a lower portion of the silicon germanium pattern near the first semiconductor layer may be larger than that of $Si_{1-x}Ge_x$ included in an upper portion of the silicon germanium pattern near the second semiconductor pattern.

In the BJT structure, each of the plurality of vertical fins may further include spacers formed on its sidewalls. The first semiconductor layer may include a first semiconductor, the second semiconductor pattern may include a second semiconductor, and the first semiconductor and the second semiconductor may be the same. The first semiconductor layer and the second semiconductor pattern may each individually include an n-doped semiconductor and the silicon germanium pattern may include p-doped silicon germanium, or the first semiconductor layer and the second semiconductor pattern may each individually include a p-doped semiconductor and the silicon germanium pattern may include n-doped silicon germanium. The germanium mole fraction x of $Si_{1-x}Ge_x$ included in the upper portion of the silicon germanium pattern may be in a range from about 0.03 to about 0.2.

According to yet another aspect of the present invention, there is provided a BJT structure including: a first semiconductor layer disposed on a substrate; a plurality of vertical fins disposed on the first semiconductor layer, spaced apart in a first direction and extending in a second direction crossing the first direction, each of the plurality of vertical fins vertically protruding in a third direction perpendicular to the first and second directions, and including a silicon germanium pattern and a second semiconductor pattern sequentially stacked on the first semiconductor layer; a dielectric material formed over the first semiconductor layer to fill all spaces among the plurality of vertical fins; and an emitter contact, a base contact and a collector contact formed within the dielectric material to connect to the second semiconductor pattern, the silicon germanium pattern and the first semiconductor layer, respectively, in which a germanium mole fraction x of silicon germanium ($Si_{1-x}Ge_x$) included in outer portions near sidewalls of the silicon germanium pattern may be larger than that of $Si_{1-x}Ge_x$ included in an inner portion of the silicon germanium pattern.

In the BJT structure, the first semiconductor layer and the second semiconductor pattern may each individually include an n-doped semiconductor and the silicon germanium pattern may include p-doped silicon germanium, or the first semiconductor layer and the second semiconductor pattern may each individually include a p-doped semiconductor and the silicon germanium pattern may include n-doped silicon germanium. The germanium mole fraction x of $Si_{1-x}Ge_x$ included in the inner portion of the silicon germanium pattern may be in a range from about 0.03 to about 0.2.

BRIEF DESCRIPTION OF THE DRAWINGS

The present invention may best be understood from the following detailed description of preferred embodiments, taken in conjunction with the accompanying drawings, and in which:

FIG. 5A is a schematic top-view diagram representing exposed silicon germanium layer above the first semiconductor layer being vertically etched away, and FIG. 5B is a schematic cross-sectional diagram of FIG. 5A taken along line A-A' according to an exemplary embodiment of the present invention;

FIG. 6A is a schematic top-view diagram representing a germanium oxide layer formed to conformally coat exposed top and sidewall surfaces of the plurality of vertical fins and the first semiconductor layer, and FIG. 6B is a schematic cross-sectional diagram of FIG. 6A taken along line A-A' according to an exemplary embodiment of the present invention;

FIG. 12A is a schematic top-view diagram representing contact openings formed for emitter, base and collector, and FIG. 12B is a schematic perspective-view diagram of FIG. 12A taken along line A-A' according to an exemplary embodiment of the present invention;

FIG. 14A is a schematic top-view diagram representing emitter contacts, base contacts and collector contacts formed to connect to the second semiconductor patterns, the silicon germanium patterns and the first semiconductor layer, respectively, in the dielectric material, in which the germanium content is higher in the outer portions of the silicon germanium patterns, and FIG. 14B is a schematic cross-sectional diagram of FIG. 14A taken along line A-A' according to an exemplary embodiment of the present invention.

Figure 1:
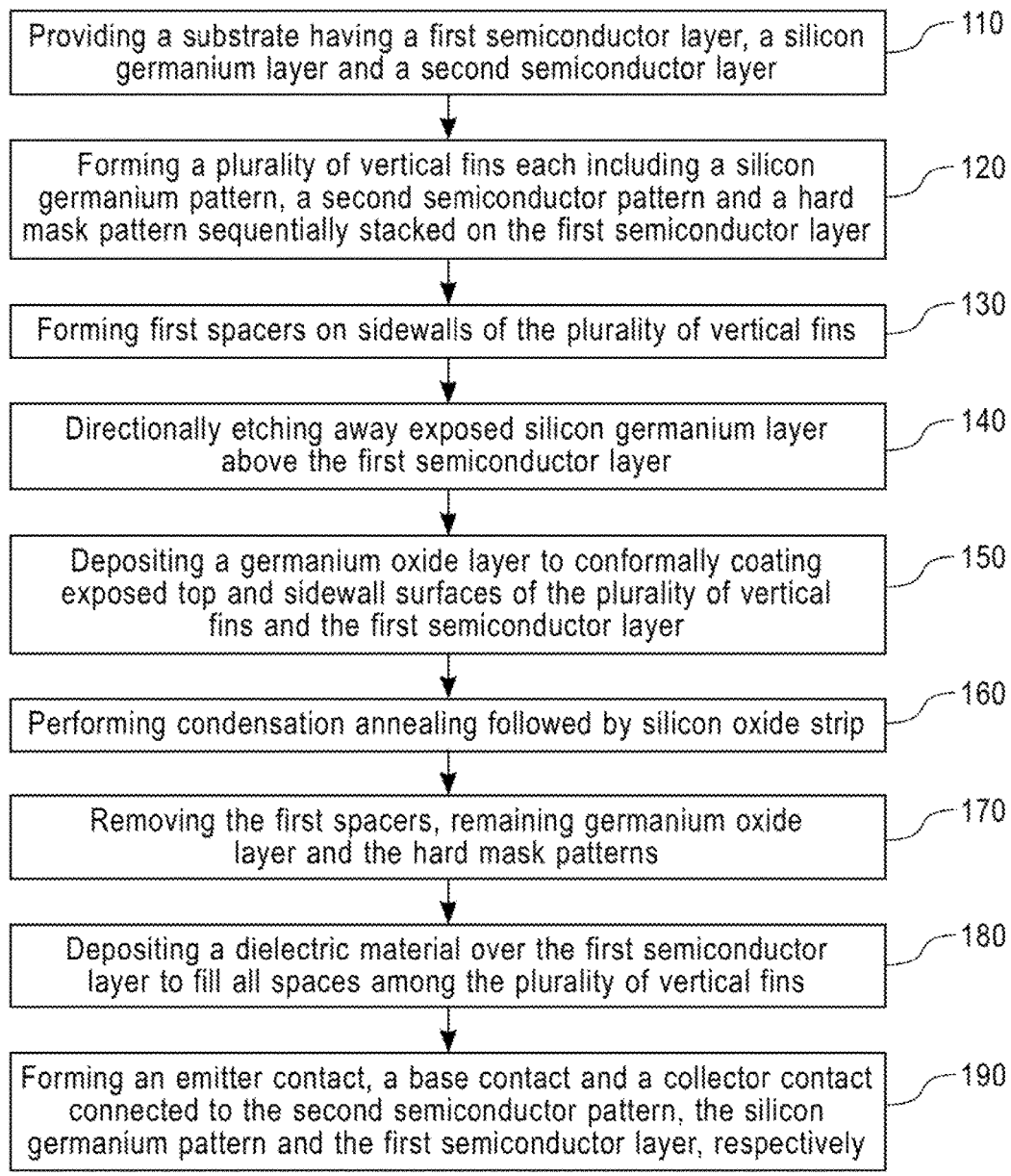
FIG. 1 is a flow chart of a method of manufacturing a bipolar junction transistor (BJT) structure according to an exemplary embodiment of the present invention.

Since the drawings in FIGS. 1-14B are intended for illustrative purpose, the elements in the drawings are not necessarily drawn to scale. For example, some of the elements may be enlarged or exaggerated for clarity purpose.

DETAILED DESCRIPTION OF PREFERRED EMBODIMENTS

The present invention relates generally to a method of manufacturing a bipolar junction transistor (BJT) structure, and the BJT structure manufactured. Specifically, the present invention relates to a method of manufacturing a vertical fin BJT structure with silicon germanium (SiGe) base having high Ge content, and the vertical fin BJT structure manufactured. More specifically, to provide a SiGe base with reasonable thickness and high Ge content without defects in comparison to epitaxially grown high Ge content SiGe with defects and strain change, reaction between germanium oxide ($GeO_2$) and SiGe is used to manufacture the vertical fin BJT structure having high Ge content SiGe base and/or gradient SiGe base. In the manufacturing method, Si in the SiGe base is selectively oxidized with $GeO_2$ capping layer to form silicon oxide ($SiO_2$) due to lower Gibbs free energy, and thus Ge content increases in SiGe base the same effect as the Ge condensation of SiGe layer on silicon on insulator (SOI) substrate except at a relatively lower temperature. Exemplary embodiments of the present invention provide a method of forming a high Ge content SiGe base and/or a gradient SiGe base in a BJT structure with $GeO_2$ capping layer, so that the SiGe base would not have defects associated with epitaxially grown SiGe base or would not incur damage due to the high temperature process used in conventional Ge condensation process, and also provide BJT structures having the high Ge content SiGe base and/or the gradient SiGe base.

It will be understood that when an element such as a layer, region or substrate is referred to as being "on" or "over" another element, it can be directly on or over the other element or intervening elements may also be present. In contrast, when an element is referred to as being "directly on" or "directly over" another element, there are no intervening elements present. As used herein, the singular forms "a", "an" and "the" are intended to include the plural forms as well, unless the context clearly indicates otherwise.

According to an exemplary embodiment of the present invention, a method of manufacturing a BJT structure may include the following steps: providing a substrate having a first semiconductor layer, a silicon germanium layer and a second semiconductor layer sequentially stacked on the substrate; pattern etching through the second semiconductor layer and recessing the silicon germanium layer to form a plurality of vertical fins spaced apart in a first direction and extending in a second direction crossing the first direction, each of the plurality of vertical fins including a silicon germanium pattern, a second semiconductor pattern and a hard mask pattern sequentially stacked on the first semiconductor layer; forming first spacers on sidewalls of the plurality of vertical fins; directionally etching away exposed silicon germanium layer above the first semiconductor layer; depositing a germanium oxide layer to conformally coat exposed top and sidewall surfaces of the plurality of vertical fins and the first semiconductor layer; performing condensation annealing followed by silicon oxide strip; removing the first spacers, remaining germanium oxide layer and the hard mask pattern of each of the plurality of vertical fins; depositing a dielectric material over the first semiconductor layer to fill all spaces among the plurality of vertical fins; and forming an emitter contact, a base contact and a collector contact connected to the second semiconductor pattern, the silicon germanium pattern and the first semiconductor layer, respectively, in the dielectric material. The sequence of the steps as described above is preferred. However, the present invention is not limited to the performance of these steps with the sequence or order presented above. Many steps may also be applied to the substrate before, between or after the steps shown above. FIG. 1 is a flow chart of a method of manufacturing a BJT structure according to an exemplary embodiment of the present invention. FIGS. 2A-14B are demonstrative illustrations of top views, perspective views or cross-sectional views of structures in the method of manufacturing the semiconductor structure according to an exemplary embodiment of the present invention.

Figure 2B:
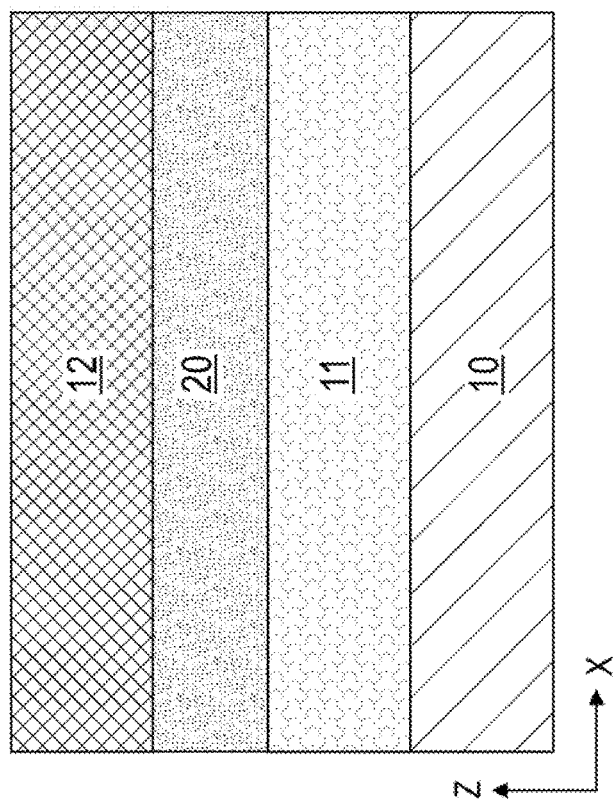
FIG. 2B is a schematic cross-sectional diagram of FIG. 2A taken along line A-A' according to an exemplary embodiment of the present invention.
Figure 2A:
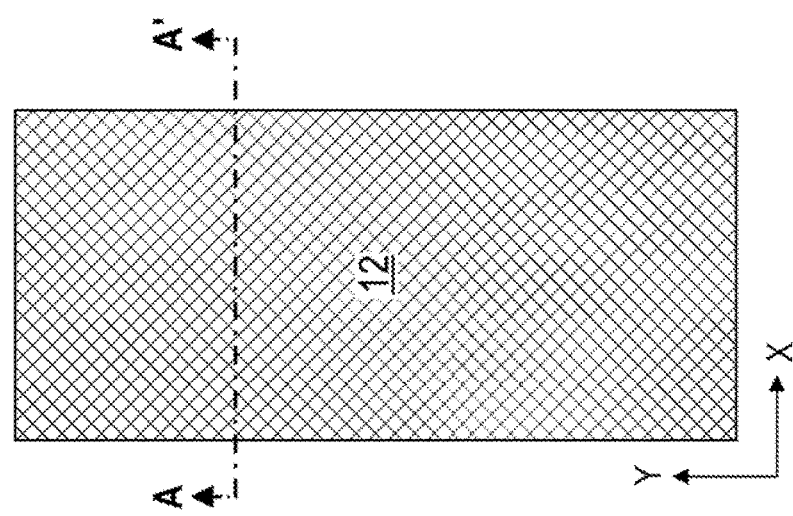
FIG. 2A is a schematic top-view diagram representing a substrate having a first semiconductor layer, a silicon germanium layer and a second semiconductor layer sequentially stacked on the substrate.

At block 110 of FIG. 1, a substrate having a first semiconductor layer, a silicon germanium layer and a second semiconductor layer may be provided. Referring to FIGS. 2A and 2B, FIG. 2A is a schematic top-view diagram representing a substrate 10 having a first semiconductor layer 11, a silicon germanium layer 20 and a second semiconductor layer 12 sequentially stacked on the substrate 10, and FIG. 2B is a schematic cross-sectional diagram of FIG. 2A taken along line A-A' according to an exemplary embodiment of the present invention. The substrate 10 may be any suitable substrate, and may include a semiconducting material such as, for example, silicon (Si), germanium (Ge), silicon germanium (SiGe), silicon carbide (SiC), gallium nitride (GaN) or gallium arsenide (GaAs), a non-semiconducting material such as, for example, silicon oxide ($SiO_2$), aluminum (Al), aluminum oxide ($Al_2O_3$), ceramic, quartz, or copper (Cu), or any combination thereof, including multilayers, for example, germanium on silicon, or silicon on insulator (SOI). The substrate 10 can include one or more semiconductor layers or structures and can include active or operable portions of semiconductor devices. For some applications, the substrate 10 may be a semiconductor substrate doped with impurities to render them p-type or n-type. In a p-doped silicon substrate, the Si substrate may be doped with p-type dopants such as, for example, boron (B), aluminum (Al), gallium (Ga) and indium (In). In an n-doped silicon substrate, the Si substrate may be doped with n-type dopants such as, for example, antimony (Sb), arsenic (As) and phosphorous (P). The preferable substrate material for the substrate 10 is silicon, and may be n-doped or p-doped.

The first and second semiconductor layers 11 and 12 may each individually include a group IV semiconductor such as, for example, silicon (Si), germanium (Ge), silicon germanium (SiGe), or silicon carbide (SiC), or a III-V semiconductor which includes at least one of group III elements of boron (B), gallium (Ga), aluminum (Al) and indium (In), and at least one of group V elements of nitrogen (N), phosphorus (P), arsenic (As), antimony (Sb) and bismuth (Bi). The first and second semiconductor layers 11 and 12 may include the same material, or may include different materials. The preferable material for both the first and second semiconductor layers 11 and 12 is Si. The first semiconductor layer 11 may be deposited on the substrate 10, or may be an extension of the substrate 10. The first semiconductor layer 11 may be n-doped or p-doped with ion implantation, and may be annealed after ion implantation. The doping concentration of the n-type dopant or p-type dopant may be in a range from about $1 \times 10^{20}$ to about $8 \times 10^{20}/cm^3$, although lesser and greater concentration may also be employed. The silicon germanium layer 20 and the second semiconductor layer 12 may be sequentially formed on the first semiconductor layer 11 with various deposition processes, and may include, physical vapor deposition (PVD), atomic layer deposition (ALD), spin coating, and an epitaxial growth process. Various epitaxial growth processes may be used to form the silicon germanium layer 20 and the second semiconductor layer 12, and may include, for example, rapid thermal chemical vapor deposition (RTCVD), low energy plasma deposition (LEPD), metal organic chemical vapor deposition (MOCVD), ultra-high vacuum chemical vapor deposition (UFIVCVD), atmospheric pressure chemical vapor deposition (APCVD) and molecular beam epitaxy (MBE). The silicon germanium layer 20 may include silicon germanium ($Si_{1-x}Ge_x$) with a Ge mole fraction x in a range from about 0.03 to about 0.2. The thickness of the silicon germanium layer 20 may be in a range from about 10 nm to about 200 nm, for example, may be in a range from about 30 nm to about 150 nm. The first and second semiconductor layers 11 and 12 may each individually include an n-doped semiconductor and the silicon germanium layer 20 may include p-doped silicon germanium. Alternatively, the first and second semiconductor layers 11 and 12 may each individually include a p-doped semiconductor and the silicon germanium layer 20 may include n-doped silicon germanium. If any of the first and second semiconductor layers 11 and 12 includes III-V semiconductor, the amount of p-type or n-type dopant that may be present may be in a range from about $1 \times 10^{18}$ to about $1 \times 10^{21}/cm^3$, although lesser and greater concentration may also be employed. The p-type dopant for III-V semiconductor may be, for example, zinc (Zn), beryllium (Be), cadmium (Cd) or magnesium (Mg). The n-type dopant for III-V semiconductor may be, for example, silicon (Si), tin (Sn), sulfur (S), or selenium (Se).

Figure 3B:
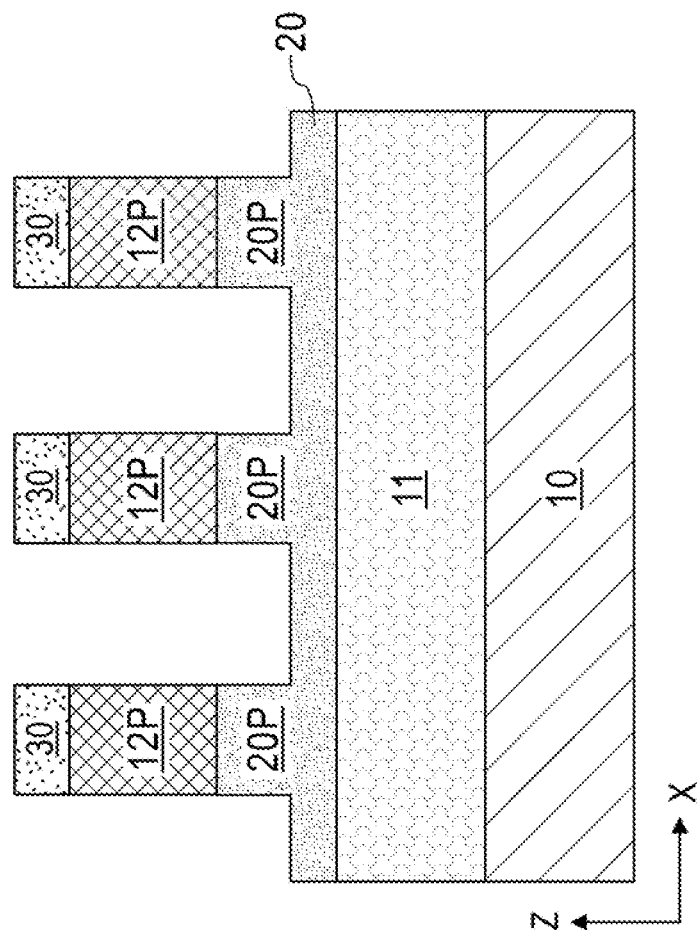
FIG. 3B is a schematic cross-sectional diagram of FIG. 3A taken along line A-A' according to an exemplary embodiment of the present invention.
Figure 3A:
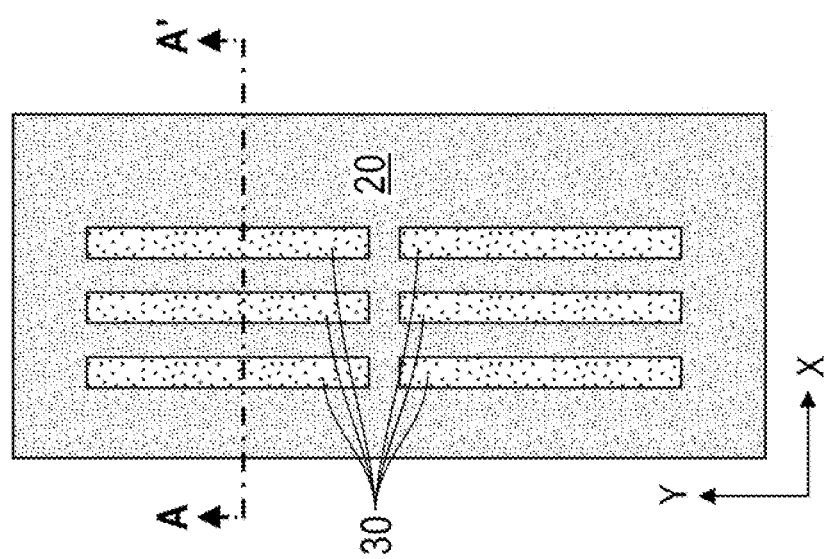
FIG. 3A is a schematic top-view diagram representing a plurality of vertical fins each including a silicon germanium pattern, a second semiconductor pattern and a hard mask pattern sequentially stacked on the first semiconductor layer.

At block 120 of FIG. 1, a plurality of vertical fins each including a silicon germanium pattern, a second semiconductor pattern and a hard mask pattern sequentially stacked on the first semiconductor layer 11 may be formed. Referring to FIGS. 3A and 3B, FIG. 3A is a schematic top-view diagram representing a plurality of vertical fins each including a silicon germanium pattern 20P, a second semiconductor pattern 12P and a hard mask pattern 30 sequentially stacked on the first semiconductor layer 11, and FIG. 3B is a schematic cross-sectional diagram of FIG. 3A taken along line A-A' according to an exemplary embodiment of the present invention. Referring to FIGS. 2B and 3B, a pattern etch may be carried out to etch through the second semiconductor layer 12 and recessing the silicon germanium layer 20 to form a plurality of vertical fins spaced apart in a first direction (X direction) and extending in a second direction (Y direction) crossing the first direction (X direction), in which each of the plurality of vertical fins vertically protrudes in a third direction (Z direction) perpendicular to the first and second directions (X and Y directions) and includes a silicon germanium pattern 20P, a second semiconductor pattern 12P and a hard mask pattern 30 sequentially stacked on the first semiconductor layer 11. The plurality of vertical fins may protrude above the recessed silicon germanium layer 20.

For forming the plurality of vertical fins, a hard mask layer may be formed on the second semiconductor layer 12, followed by patterning the hard mask layer through a photolithographic process and an etching process to form the hard mask patterns 30, and then the plurality of vertical fins may be formed by etching the second semiconductor layer 12 and the silicon germanium layer 20 with the hard mask patterns 30 as an etch mask. Thus, each of the hard mask patterns 30 may have its shape and size the same as those of each of the plurality of vertical fins in the X-Y plan. The hard mask layer may include any hard mask material such as, for example, silicon dioxide ($SiO_2$), silicon nitride ($Si_3N_4$) and/or silicon oxynitride (SiON). The thickness of the hard mask layer may be in a range from 5 nm to 30 nm, although lesser and greater thicknesses may also be employed. The hard mask layer may be formed on the second semiconductor layer 12 with various deposition processes include, but are not limited to: physical vapor deposition (PVD), chemical vapor deposition (CVD), atomic layer deposition (ALD)), and spin coating. A typical photolithographic process may include the following steps: preparing substrate, coating photoresist, baking, exposing and developing. The patterning process may use a positive tone resist with a positive tone development process or may use negative tone development (NTD) process with solvent-based developer. The recessing of the silicon germanium layer 20 may include recessing from about 20% to about 80% of a thickness of the silicon germanium layer 20. However, the present invention is not limited thereto. For example, the depth of the recess may be less than about 20% or may be greater than about 80%. The recess of the silicon germanium layer 20 is to create higher Ge content in the lower portion of the silicon germanium pattern 20P in the latter process step. Without recess, higher Ge content may still be obtained in an exemplary embodiment of the present invention, but the graded Ge content in the third direction (Z direction) in silicon germanium pattern 20P may not be obtained.

Figure 4B:
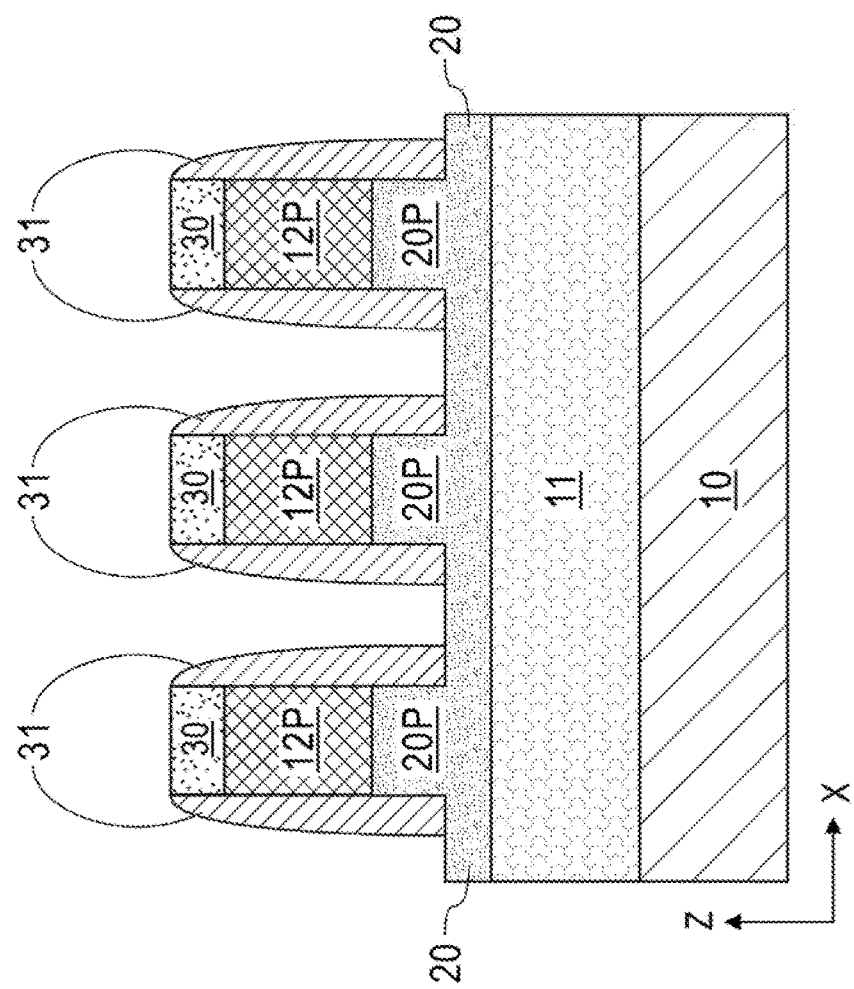
FIG. 4B is a schematic cross-sectional diagram of FIG. 4A taken along line A-A' according to an exemplary embodiment of the present invention.
Figure 4A:
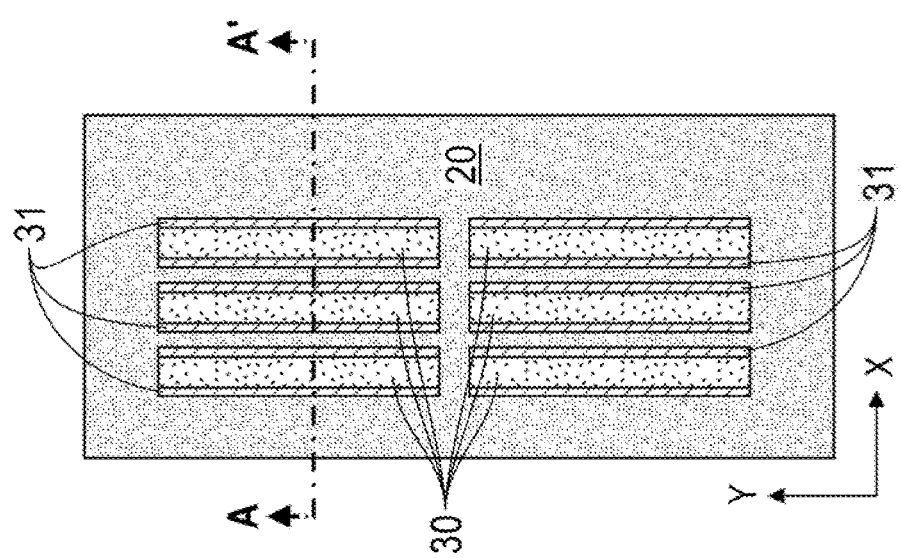
FIG. 4A is a schematic top-view diagram representing first spacers formed on sidewalls of the plurality of vertical fins.

At block 130 of FIG. 1, first spacers may be formed on sidewalls of the plurality of vertical fins. Referring to FIGS. 4A and 4B, FIG. 4A is a schematic top-view diagram representing first spacers 31 formed on sidewalls of the plurality of vertical fins, and FIG. 4B is a schematic cross-sectional diagram of FIG. 4A taken along line A-A' according to an exemplary embodiment of the present invention. A layer of first spacer material may be formed to cover the surface of the entire top area of the substrate 10 including the exposed top surface of the silicon germanium layer 20, the tops and sidewalls of the plurality of vertical fins, by conformally depositing the first spacer material onto the substrate 10. Examples of deposition processes that may be used in providing the first spacer material may include, for example, CVD, plasma enhanced CVD (PECVD), or ALD. The new layer of the first spacer material may include silicon oxide ($SiO_2$), silicon nitride ($Si_3N_4$), titanium nitride (TiN), boron nitride (BN), amorphous carbon (a-C), metal, and/or metal oxide, and may have a thickness ranging from about 4 nm to about 20 nm and should be proportional to the size of the feature intended to be patterned. Preferably, the material for the first spacers 31 is silicon nitride. ALD method is suitable for making smooth, conformal layers. To form the first spacers 31 on the sidewalls of the plurality of vertical fins, the conformal nitride layer may be etched, for example, by a reactive ion etch (RIE) process. The directional etch may remove the nitride from horizontal top surfaces of all features, and may then leave the nitride on the sidewalls of the plurality of vertical fins.

At block 140 of FIG. 1, exposed silicon germanium layer 20 above the first semiconductor layer 11 may be directionally etched away. Referring to FIGS. 5A and 5B, FIG. 5A is a schematic top-view diagram representing exposed silicon germanium layer 20 above the first semiconductor layer 11 being vertically etched away, and FIG. 5B is a schematic cross-sectional diagram of FIG. 5A taken along line A-A' according to an exemplary embodiment of the present invention. To recess the exposed silicon germanium layer 20 up to the first semiconductor layer 11 between adjacent vertical fins, which include the first spacers 31, a selective etch that etches the exposed silicon germanium layer 20 selectively against the hard mask patterns 30, the first spacers 31 and the first semiconductor layer 11 may be employed. The etchant used in etching away the exposed silicon germanium layer 20 may include hydrochloric acid (HCl). As shown in FIG. 5B, after the exposed silicon germanium layer 20 above the first semiconductor layer 11 being directionally etched away, the silicon germanium pattern 20P may become a reverse "T" shape, and may include portions under the first spacers 31.

At block 150 of FIG. 1, a germanium oxide layer may be deposited to conformally coating exposed top and sidewall surfaces of the plurality of vertical fins and the first semiconductor layer 11. Referring to FIGS. 6A and 6B, FIG. 6A is a schematic top-view diagram representing a germanium oxide layer 40 formed to conformally coat exposed top and sidewall surfaces of the plurality of vertical fins and the first semiconductor layer 11, and FIG. 6B is a schematic cross-sectional diagram of FIG. 6A taken along line A-A' according to an exemplary embodiment of the present invention. Examples of deposition processes that may be used in depositing the germanium oxide layer 40 may include, for example, CVD, PECVD, or ALD. ALD method is suitable for making smooth, conformal layers, and is a preferable method for depositing the germanium oxide layer 40. The thickness of the germanium oxide layer 40 may be in a range from about 1 nm to about 10 nm, for example, in a range from about 2 nm to about 4 nm, although lesser and greater thicknesses may also be employed.

Figure 7B:
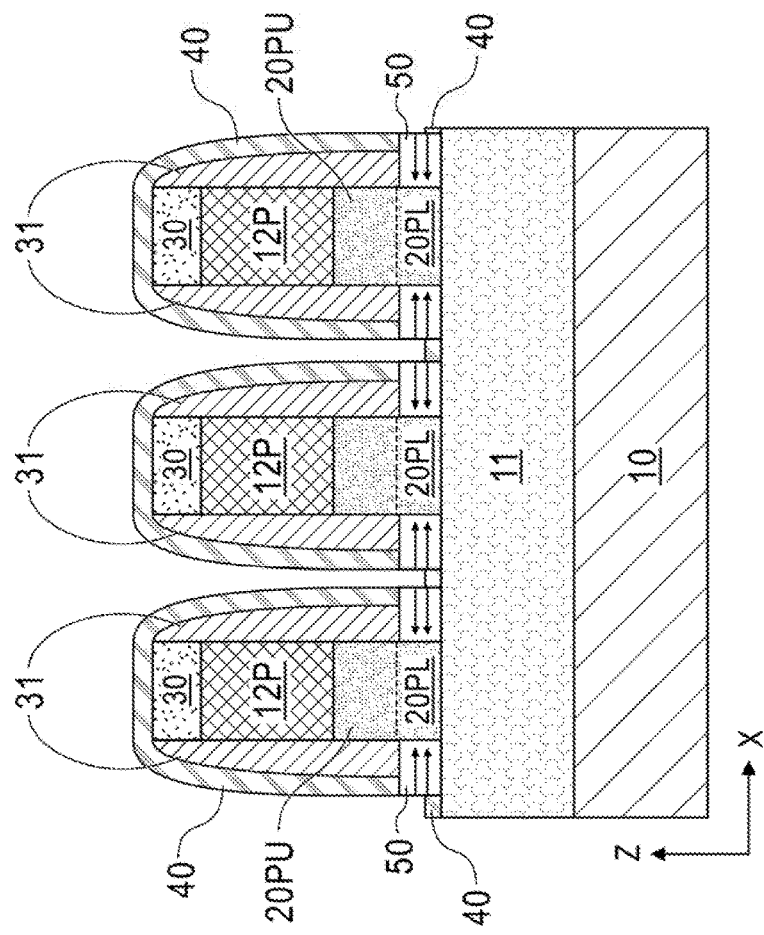
FIG. 7B is a schematic cross-sectional diagram of FIG. 7A taken along line A-A' according to an exemplary embodiment of the present invention.
Figure 7A:
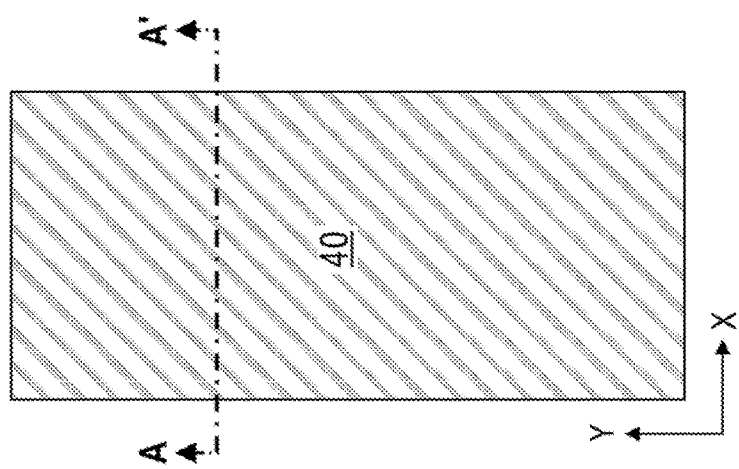
FIG. 7A is a schematic top-view diagram representing germanium oxide of the germanium oxide layer reacting with silicon germanium to increase the germanium content in the lower portion of the silicon germanium pattern and leaving formed silicon oxide behind during a condensation annealing.

At block 160 of FIG. 1, condensation annealing may be performed followed by silicon oxide strip. Referring to FIGS. 7A and 7B, FIG. 7A is a schematic top-view diagram representing germanium oxide of the germanium oxide layer 40 reacting with silicon germanium to increase the germanium content in the lower portion of the silicon germanium pattern 20PL and leaving formed silicon oxide 50 behind during a condensation annealing, and FIG. 7B is a schematic cross-sectional diagram of FIG. 7A taken along line A-A' according to an exemplary embodiment of the present invention. The condensation annealing may be performed under nitrogen at a temperature in a range from about 500° C. to about 700° C. For example, the condensation annealing may be performed under nitrogen at about 600° C. In the condensation annealing process, Si in the SiGe of the silicon germanium pattern 20P is selectively oxidized by $GeO_2$ of the germanium oxide layer 40 to form silicon oxide 50 due to lower Gibbs free energy, and thus Ge content increases in the silicon germanium pattern 20 the same effect as the conventional Ge condensation of a SiGe layer on SOI substrate except at a relatively lower temperature. The conventional Ge condensation process may require a temperature higher than 950° C. oxidation process, and may not be compatible with the advanced CMOS technology. In addition, Ge out diffusion cannot be controlled at this high temperature. The reaction occurred during the condensation annealing process may be represented by the chemical equation below:

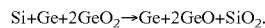

$$Si+Ge+2GeO_2 \rightarrow Ge+2GeO+SiO_2.$$

The first two components Si and Ge in the above equation represent the elements of the SiGe in the silicon germanium pattern 20P. In the reaction, the Si component of the SiGe is oxidized by the $GeO_2$ of the germanium oxide layer 40 to form $SiO_2$ as shown in the formed silicon oxide 50 in FIG. 7B. The Ge formed in the reaction may then diffuse into the lower portion of the silicon germanium pattern 20PL to increase the Ge content in that portion. The arrows in FIG. 7B represent the diffusion direction of the Ge. The component GeO formed is volatile, and may be evaporated during the annealing process. After the condensation annealing, the formed silicon oxide 50 may be stripped. The formed silicon oxide 50 may be stripped with dilute hydrofluoric acid (DHF). During the stripping of the formed silicon oxide 50 process, some or all of the germanium oxide layer 40 may also be removed. After the formed silicon oxide 50 strip, a new germanium oxide layer may be deposited again followed by condensation annealing and a newly formed silicon oxide strip. This deposition, annealing and stripping process may be repeated several times depending on the side thickness (portions under the first spacers 31) and/or the desired Ge content in the lower portion of the silicon germanium pattern 20PL. In other words, the depositing of the germanium oxide layer 40 and the performing of the condensation annealing followed by formed silicon oxide 50 strip may be repeated sequentially two or more times. After performing the condensation annealing, the germanium mole fraction x of $Si_{1-x}Ge_x$ included in the lower portion of the silicon germanium pattern 20PL near the first semiconductor layer 11 may be larger than that of $Si_{1-x}Ge_x$ included in the upper portion of the silicon germanium pattern 20PU near the second semiconductor pattern 12P. The germanium mole fraction x of $Si_{1-x}Ge_x$ included in the lower portion of the silicon germanium pattern 20PL after condensation annealing may be larger than 0.2, for example, may be larger than 0.3, but the present invention is not limited thereto. For example, by repeating the condensation annealing followed by formed silicon oxide 50 strip several times, the germanium mole fraction x of $Si_{1-x}Ge_x$ included in the lower portion of the silicon germanium pattern 20PL higher than 0.5 may be obtained. Here, the lower portion of the silicon germanium pattern 20PL may be a portion located at least lower than the half height level of the silicon germanium pattern 20P. The gradient is created in such a way that the silicon germanium pattern 20P in the lower portion near the first semiconductor layer 11 has high Ge content, and then the Ge content of the silicon germanium pattern 20P gradually decreases toward the upper portion.

Figure 8B:
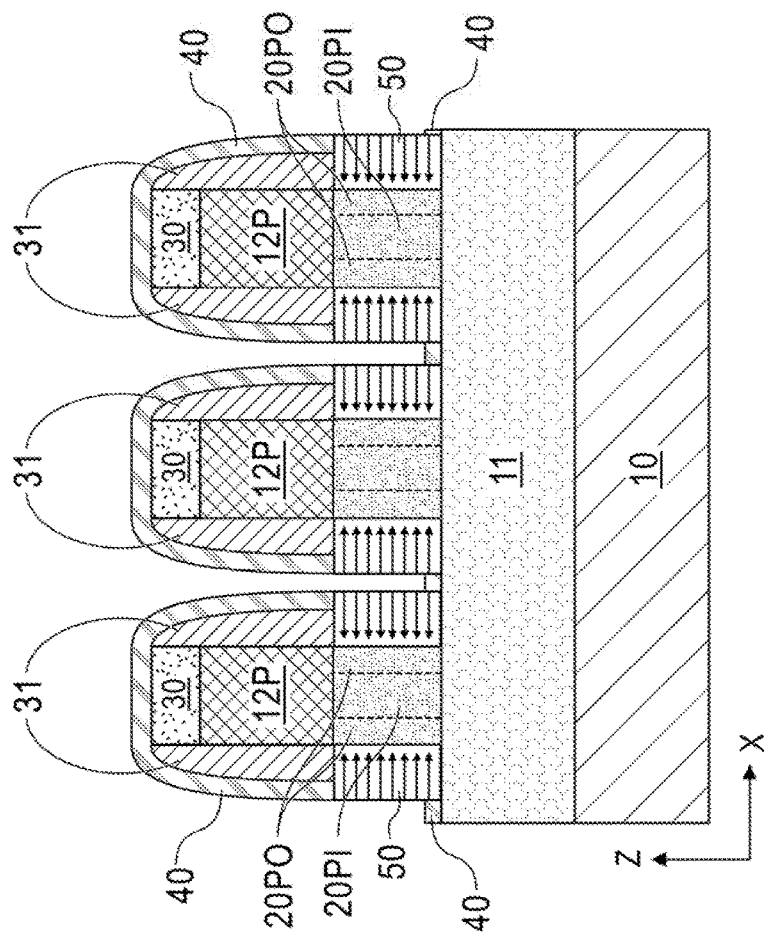
FIG. 8B is a schematic cross-sectional diagram of FIG. 8A taken along line A-A' according to an exemplary embodiment of the present invention.
Figure 8A:
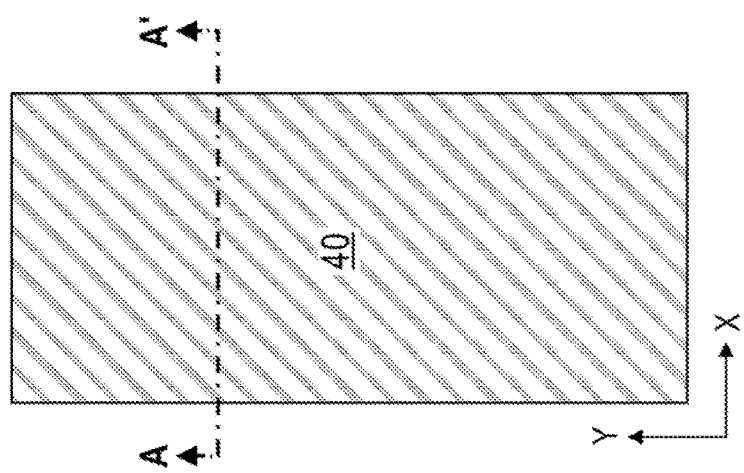
FIG. 8A is a schematic top-view diagram representing germanium oxide of the germanium oxide layer reacting with silicon germanium to increase the germanium content in the outer portion of the silicon germanium pattern and leaving formed silicon oxide behind during a condensation annealing.

In an exemplary embodiment of the present invention, after performing the condensation annealing, the germanium mole fraction x of silicon germanium ($Si_{1-x}Ge_x$) included in the outer portions near sidewalls of the silicon germanium pattern 20P may be larger than that of $Si_{1-x}Ge_x$ included in an inner portion of the silicon germanium pattern 20PI. Referring to FIGS. 8A and 8B, FIG. 8A is a schematic top-view diagram representing germanium oxide of the germanium oxide layer 40 reacting with silicon germanium to increase the germanium content in the outer portion of the silicon germanium pattern 20PO and leaving formed silicon oxide 50 behind during a condensation annealing, and FIG. 8B is a schematic cross-sectional diagram of FIG. 8A taken along line A-A' according to an exemplary embodiment of the present invention. Different from the step of carrying out the pattern etch to etch through the second semiconductor layer 12 and recessing the silicon germanium layer 20 to form a plurality of vertical fins as shown in FIG. 3B described above, in the present exemplary embodiment, a pattern etch may be carried out to etch through the second semiconductor layer 12 to form a plurality of vertical fins spaced apart in the first direction (X direction) and extending in the second direction (Y direction) crossing the first direction (X direction), in which each of the plurality of vertical fins vertically protrudes in a third direction (Z direction) perpendicular to the first and second directions (X and Y directions) and includes a second semiconductor pattern 12P and a hard mask pattern 30 sequentially stacked on the silicon germanium layer 20. The plurality of vertical fins may protrude above the silicon germanium layer 20. Then, the formation of the first spacers 31 and the directional etch of the exposed portion of the silicon germanium layer 20 may be performed. In this case, the germanium oxide layer 40 coated may contact both upper and lower portion of the silicon germanium patterns 20P. The recess of the silicon germanium layer 20 in FIG. 3B is to create higher Ge content in the lower portion of the silicon germanium pattern 20P as shown in FIG. 7B. Without recess, higher Ge content may be obtained in the outer portions of the silicon germanium pattern 20PO as shown in FIG. 8B in the present exemplary embodiment, but the graded Ge content in the third direction (Z direction) in silicon germanium pattern 20P may not be obtained. The gradient is created in such a way that the silicon germanium pattern 20P in the outer portion near the sidewalls has high Ge content, and then the Ge content of the silicon germanium pattern 20P gradually decreases toward the inner portion. That is, after performing the condensation annealing process, the germanium mole fraction x of $Si_{1-x}Ge_x$ included in the outer portions near sidewalls of the silicon germanium pattern 20PO may be larger than that of $Si_{1-x}Ge_x$ included in an inner portion of the silicon germanium pattern 20PI. Similar to the process carried out in FIG. 7B, in the present exemplary embodiment, the depositing of the germanium oxide layer 40 and the performing of the condensation annealing followed by formed silicon oxide 50 strip may also be repeated sequentially two or more times. The germanium mole fraction x of $Si_{1-x}Ge_x$ included in the outer portion of the silicon germanium pattern 20PO after condensation annealing may be larger than 0.2, for example, may be larger than 0.3, but the present invention is not limited thereto. The germanium mole fraction x of $Si_{1-x}Ge_x$ included at or close to the sidewalls may be about 1.0.

Figure 9B:
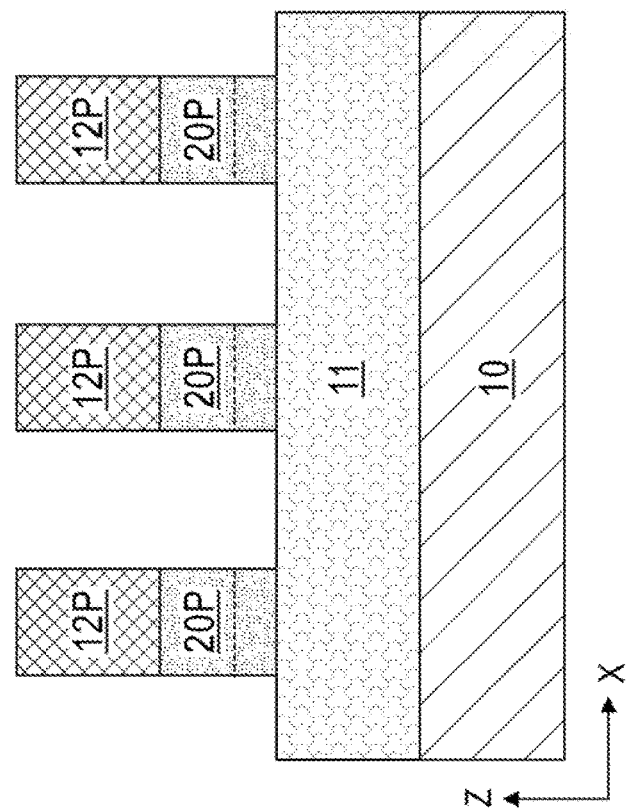
FIG. 9B is a schematic cross-sectional diagram of FIG. 9A taken along line A-A' according to an exemplary embodiment of the present invention.
Figure 9A:
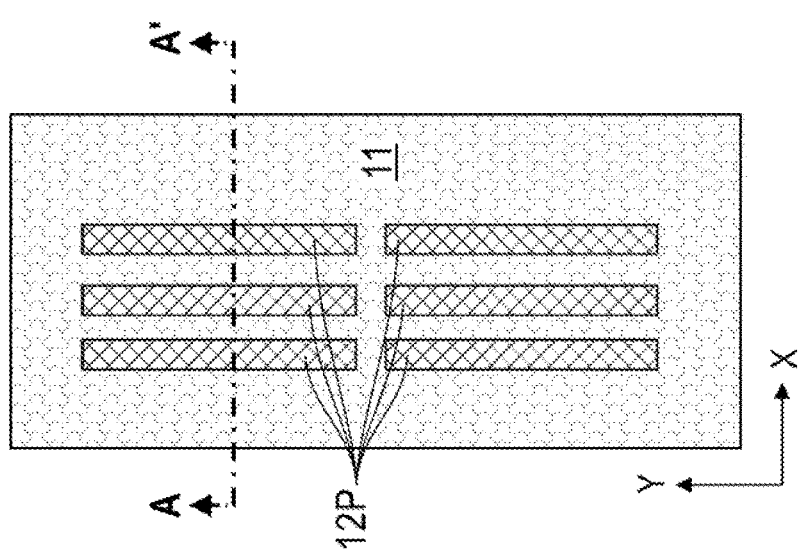
FIG. 9A is a schematic top-view diagram representing the first spacers, remaining germanium oxide layer and the hard mask patterns removed.

At block 170 of FIG. 1, the first spacers 31, remaining germanium oxide layer 40 and the hard mask patterns 30 may be removed. Referring to FIGS. 9A and 9B, FIG. 9A is a schematic top-view diagram representing the first spacers 31, remaining germanium oxide layer 40 and the hard mask patterns 30 removed, and FIG. 9B is a schematic cross-sectional diagram of FIG. 9A taken along line A-A' according to an exemplary embodiment of the present invention. The germanium oxide layer 40 may be stripped with DHF at the same time the formed silicon oxide 50 is stripped. Any remaining germanium oxide layer 40 or any remaining formed silicon oxide 50 may be further removed with longer treatment with DHF. When the first spacers 31 and the hard mask patterns 30 are silicon nitride, they may be removed by RIE with $CF_3I/O_2/H_2$ or $Cl_2/He/HBr$. After the removal of the first spacers 31, the remaining germanium oxide layer 40 and the hard mask patterns 30, the plurality of vertical fins may each include the silicon germanium pattern 20P and the second semiconductor pattern 12P sequentially stacked on the first semiconductor layer 11. In the silicon germanium pattern 20P of each of the plurality of vertical fins, the germanium mole fraction x of $Si_{1-x}Ge_x$ included in the lower portion of the silicon germanium pattern 20PL near the first semiconductor layer 11 may be larger than that of $Si_{1-x}Ge_x$ included in the upper portion of the silicon germanium pattern 20PU near the second semiconductor pattern 12P.

Figure 10B:
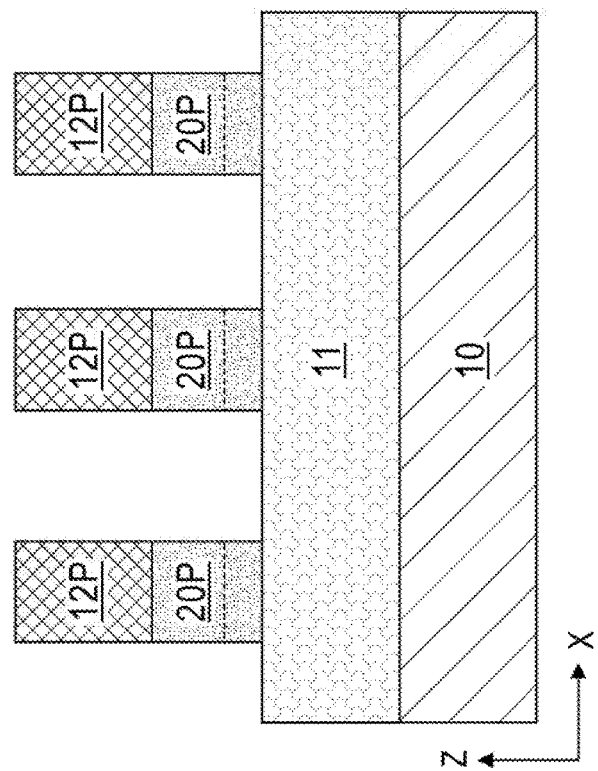
FIG. 10B is a schematic cross-sectional diagram of FIG. 10A taken along line A-A' according to an exemplary embodiment of the present invention.
Figure 10A:
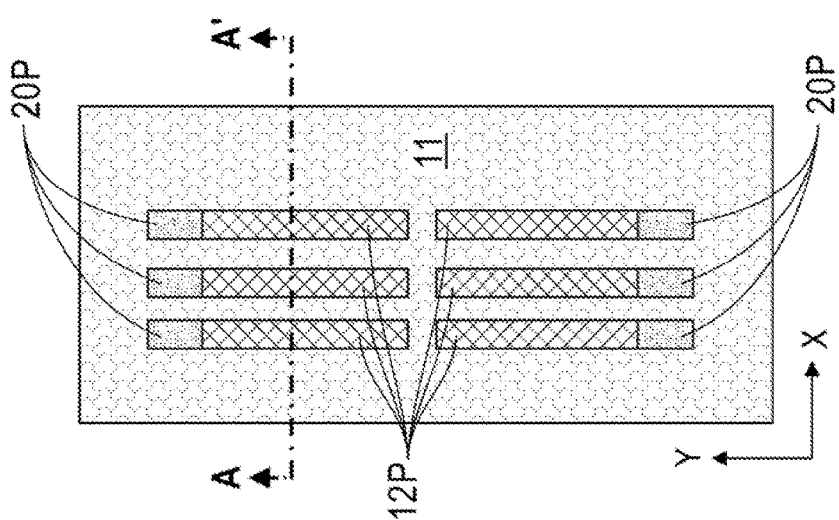
FIG. 10A is a schematic top-view diagram representing a portion of the second semiconductor pattern above the silicon germanium pattern selectively removed.

In an exemplary embodiment of the present invention, after removing the first spacers 31, remaining germanium oxide layer 40 and the hard mask patterns 30, a portion of the second semiconductor pattern 12P above the silicon germanium pattern 20P may be removed for forming a base contact in a subsequent step. Referring to FIGS. 10A and 10B, FIG. 10A is a schematic top-view diagram representing a portion of the second semiconductor pattern 12P above the silicon germanium pattern 20P selectively removed, and FIG. 10B is a schematic cross-sectional diagram of FIG. 10A taken along line A-A' according to an exemplary embodiment of the present invention. As shown in FIG. 10A, end portions of the plurality of vertical fins may be etched to remove these portions of the second semiconductor patterns 12P above the silicon germanium patterns 20P. Before the etching process, for example, a mask pattern with a rectangle shape opening extending in the first direction (X direction) across the plurality of vertical fins may be formed. Depending on the desired device structure, other shapes besides rectangle shape may also be used for the mask pattern. For example, the shape of the openings may be circle, square, triangle, trapezoid, rhombus, oval, hexagon, or any other suitable shapes. Due to the topographic structure of the plurality of vertical fins, a tri-layer photolithographic process may be used to form the mask pattern with the rectangle shape. The tri-layer photolithographic process may include the following steps: spin coating a spin-on hard mask layer to cover the plurality of vertical fins; depositing a silicon containing antireflective coating interlayer on the spin-on hard mask layer; spin coating a photoresist layer on the silicon containing antireflective coating interlayer; exposing the photoresist layer with a photomask containing a rectangle shape pattern; and baking and developing the exposed photoresist layer to form a photoresist pattern containing the rectangle shape opening. Various etchants may be used to etch the silicon containing antireflective coating interlayer, the spin-on hard mask layer and the second semiconductor patterns 12P. When the second semiconductor pattern 12P is formed of Si, the silicon etch process with RIE may use etchants such as: $Cl_2/HBr/CF_4/O_2$, and/or $HBr/O_2$. Wet etch process may also be used to selectively etch Si, and may include, for example, an alkaline solution such as tetramethylammonium hydroxide (TMAH) or a solution containing the following components: $HNO_3(70\%)/HF(49\%)/CH_3COOH(99.9\%)/H_2O$.

Figure 11B:
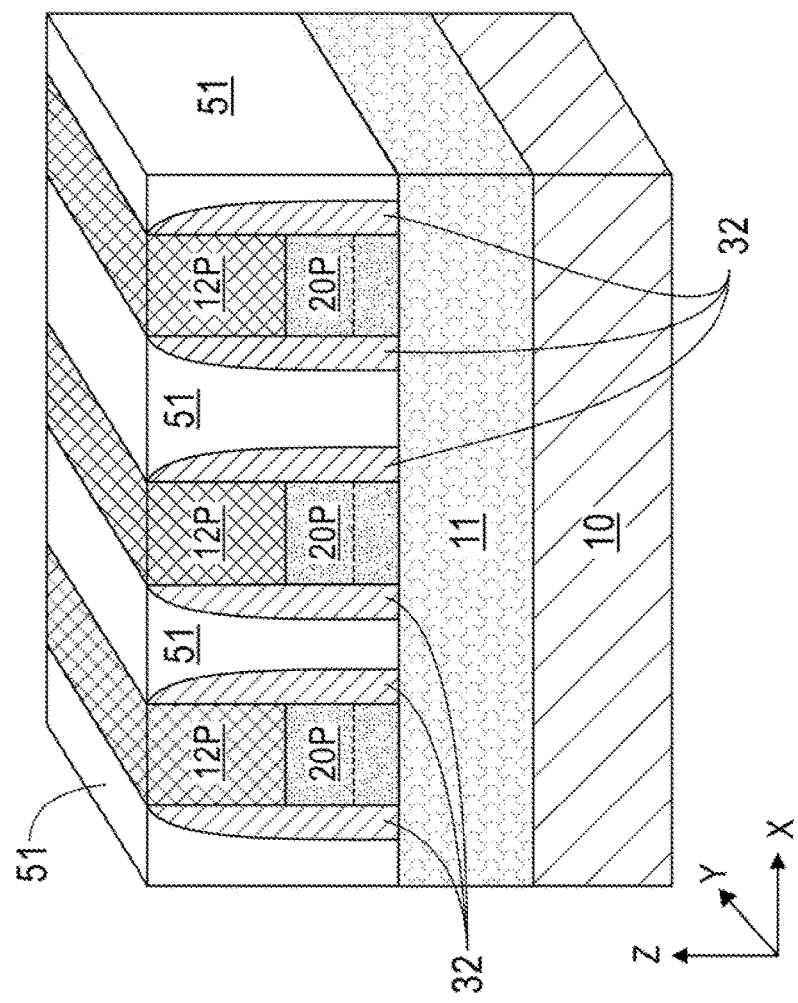
FIG. 11B is a schematic perspective-view diagram of FIG. 11A taken along line A-A' according to an exemplary embodiment of the present invention.
Figure 11A:
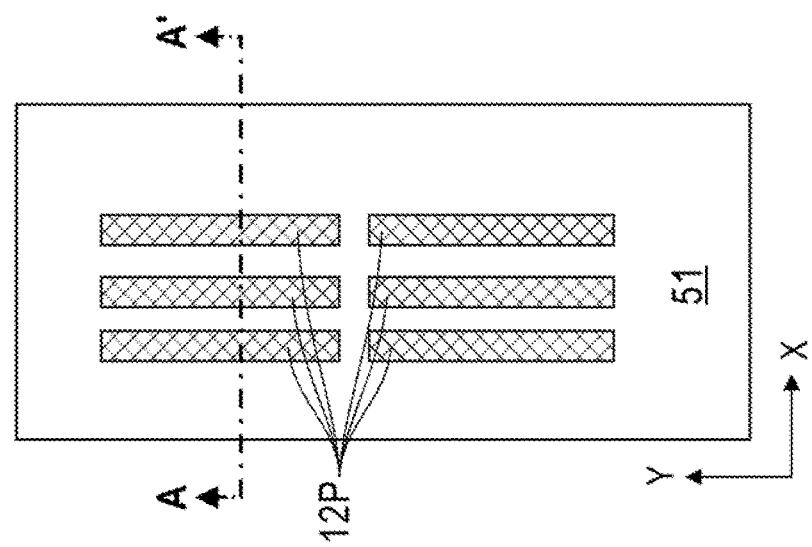
FIG. 11A is a schematic top-view diagram representing second spacers formed on sidewalls of the plurality of vertical fins and a dielectric material formed over the first semiconductor layer to fill all spaces among the plurality of vertical fins.

At block 180 of FIG. 1, a dielectric material may be deposited over the first semiconductor layer 11 to fill all spaces among the plurality of vertical fins. Referring to FIGS. 11A and 11B, FIG. 11A is a schematic top-view diagram representing second spacers 32 formed on sidewalls of the plurality of vertical fins and a dielectric material 51 formed over the first semiconductor layer 11 to fill all spaces among the plurality of vertical fins, and FIG. 11B is a schematic perspective-view diagram of FIG. 11A taken along line A-A' according to an exemplary embodiment of the present invention. In an exemplary embodiment of the present invention, before the deposition of the dielectric material 51, the second spacers 32 may be formed on sidewalls of the plurality of vertical fins. The second spacers 32 may include a material the same as that of the first spacers 31. The dielectric material 51 may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluorethylene or PTFE), silicon oxyfluoride (FSG), carbon doped $SiO_2$ (SiCO), hydrogenated silicon oxycarbide (SiCOH), or other low k dielectric materials. The preferable material for the dielectric material 51 is $SiO_2$. The dielectric material 51 may be formed by a deposition process including, for example, CVD, PECVD, evaporation or spin coating. The dielectric material 51 may be deposited to completely cover the first semiconductor layer 11 and the plurality of vertical fins, and then a chemical mechanical polishing (CMP) process may be used to planarize the top surface of the dielectric material 51 until the top surface of the second semiconductor pattern 12P is exposed.

At block 190 of FIG. 1, an emitter contact, a base contact and a collector contact may be formed to connect to the second semiconductor pattern 12P, the silicon germanium pattern 20P and the first semiconductor layer 11, respectively. Referring to FIGS. 12A, 12B, FIG. 12A is a schematic top-view diagram representing contact openings 91, 92 and 93 formed for emitter, base and collector, and FIG. 12B is a schematic perspective-view diagram of FIG. 12A taken along line A-A' according to an exemplary embodiment of the present invention. To form the emitter contact openings 91, the base contact openings 92 and the collector contact openings 93, may each require at least a photolithographic process and an etch process. The photolithographic process used here may be the same as that carried out to form the hard mask patterns 30 described above. When the dielectric material 51 is formed of $SiO_2$, to pattern etch the dielectric material 51 may use etchants containing fluorine, such as: $CF_4$, and/or $CF_2/CH_2F_2$. As shown in FIG. 12A, the emitter contact openings 91 are each a rectangle shape opening extending in the first direction (X direction) across the plurality of vertical fins. Depending on the desired device structure, other shapes besides rectangle shape may also be used for the emitter contact openings 91. For example, the shape of the emitter contact openings 91 may be circle, square, triangle, trapezoid, rhombus, oval, hexagon, or any other suitable shapes. The emitter contact openings 91 may each have a depth in the dielectric material 51 and the second semiconductor pattern 12P sufficient for forming an emitter contact. As shown in FIG. 12A, the base contact openings 92 are each a rectangle shape opening extending in the first direction (X direction) across the end portions of the plurality of vertical fins, where the portions of the second semiconductor pattern 12P above the silicon germanium pattern 20P have been removed in the previous process step. Depending on the desired device structure, other shapes besides rectangle shape may also be used for the base contact openings 92. The base contact openings 92 may each have a depth in the dielectric material 51 sufficient deep to expose the silicon germanium patterns 20P. In addition, third spacers 33 may be formed on sidewalls of the base contact openings 92, and may also on sidewalls of the silicon germanium patterns 20P. As shown in FIG. 12A, the collector contact openings 93 are each a rectangle shape opening extending in the second direction (Y direction) parallel to the plurality of vertical fins. Depending on the desired device structure, other shapes besides rectangle shape may also be used for the collector contact openings 93. The collector contact openings 93 may each have a depth in the dielectric material 51 sufficient deep to expose the first semiconductor layer 11. In addition, fourth spacers 34 may be formed on sidewalls of the collector contact openings 93.

Figure 13B:
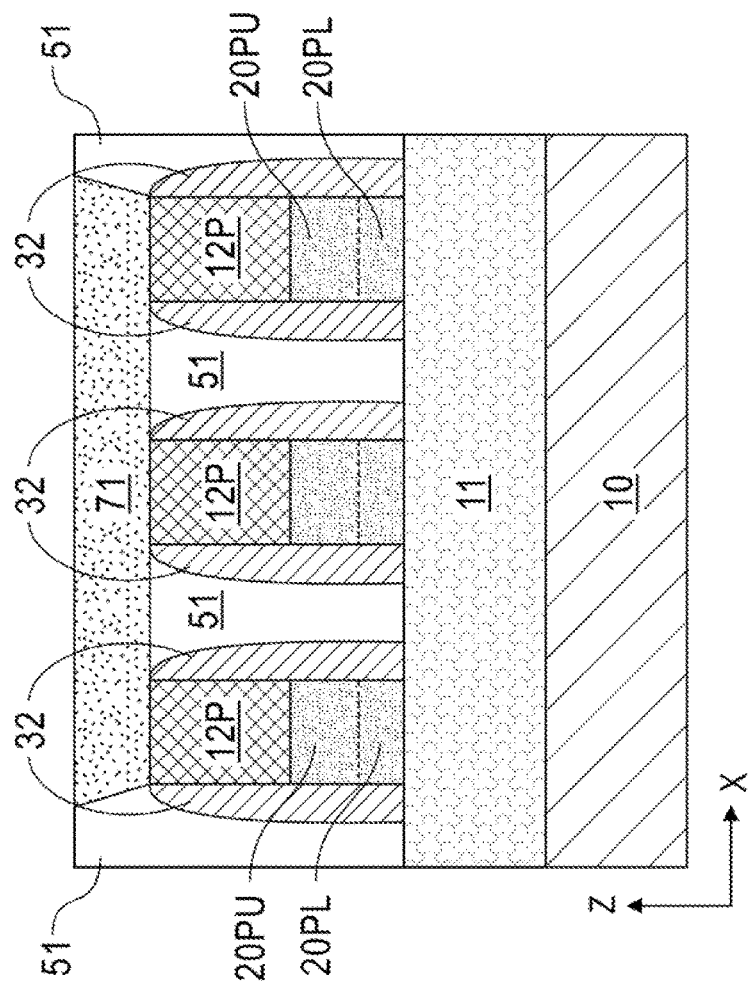
FIG. 13B is a schematic cross-sectional diagram of FIG. 13A taken along line A-A' according to an exemplary embodiment of the present invention.
Figure 13A:
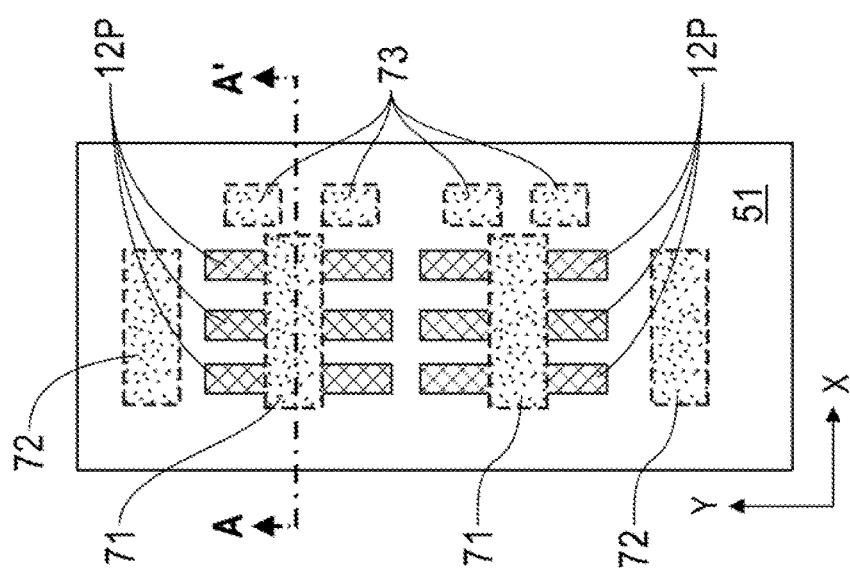
FIG. 13A is a schematic top-view diagram representing emitter contacts, base contacts and collector contacts formed to connect to the second semiconductor patterns, the silicon germanium patterns and the first semiconductor layer, respectively, in the dielectric material.

Referring to FIGS. 13A and 13B, FIG. 13A is a schematic top-view diagram representing emitter contacts 71, base contacts 72 and collector contacts 73 formed to connect to the second semiconductor patterns 12P, the silicon germanium patterns 20P and the first semiconductor layer 11, respectively, in the dielectric material 51, and FIG. 13B is a schematic cross-sectional diagram of FIG. 13A taken along line A-A' according to an exemplary embodiment of the present invention. One or more conductive materials may be deposited to fill the emitter contact openings 91, the base contact openings 92 and the collector contact openings 93 to form the emitter contacts 71, the base contacts 72 and the collector contacts 73 to connect to the second semiconductor patterns 12P, the silicon germanium patterns 20P and the first semiconductor layer 11, respectively. The conductive material may include an n-type work function metal such as, for example, titanium (Ti), aluminum (Al), titanium aluminide (TiAl), titanium aluminum nitride (TiAlN), tantalum carbide (TaC), niobium (Nb) or the like, or may include a p-type work function metal such as, for example, titanium nitride (TiN), tungsten nitride (WN), tantalum nitride (TaN) and ruthenium (Ru) or the like for NPN or PNP BJTs. Alternatively, the conductive material may include a metal, for example, gold (Au), titanium (Ti), copper (Cu), silver (Ag), Aluminum (Al), tungsten (W), cobalt (Co), Chromium (Cr), molybdenum (Mo), zirconium (Zr), nickel (Ni), tantalum (Ta), platinum (Pt), or an alloy thereof. The emitter contacts 71, the base contacts 72 and the collector contacts 73 may each be formed as a multilayer, for example, Ni/Ti/Al, Ni/Au, Ti/Al, Ti/Al/Ni/Au or the like. One or more conductive materials may be deposited to fill the emitter contact openings 91, the base contact openings 92 and the collector contact openings 93 to form the emitter contacts 71, the base contacts 72 and the collector contacts 73, respectively, with various deposition processes include, but are not limited to: physical vapor deposition (PVD), chemical vapor deposition (CVD), atomic layer deposition (ALD), electrochemical deposition (ECD), electroplating, electroless plating and spin coating. Each of the conductive materials after deposition may be planarized with a planarization process, for example, CMP process until the top surface of the dielectric material 51 is exposed, thereby forming the emitter contacts 71, the base contacts 72 and/or the collector contacts 73. The emitter contacts 71, the base contacts 72 and the collector contacts 73 may be formed together at the same time or formed separately.

In FIGS. 13A and 13B, the second semiconductor pattern 12P may function as the emitter, the graded silicon germanium pattern 20P may function as the base, and the first semiconductor layer 11 may function as the collector for the vertical fin BJT. The silicon germanium pattern 20P may have high Ge content in the lower portion.

An exemplary embodiment of the present invention may include a BJT structure with SiGe base having high Ge content as shown in FIGS. 13A and 13B. The BJT structure may include: a first semiconductor layer 11 disposed on a substrate 10; a plurality of vertical fins disposed on the first semiconductor layer 11, spaced apart in a first direction and extending in a second direction crossing the first direction, each of the plurality of vertical fins vertically protruding in a third direction perpendicular to the first and second directions, and including a silicon germanium pattern 20P and a second semiconductor pattern 12P sequentially stacked on the first semiconductor layer 11; a dielectric material 51 formed over the first semiconductor layer 11 to fill all spaces among the plurality of vertical fins; and an emitter contact 71, a base contact 72 and a collector contact 73 formed within the dielectric material 51 to connect to the second semiconductor pattern 12P, the silicon germanium pattern 20P and the first semiconductor layer 11, respectively, in which a germanium mole fraction x of silicon germanium ($Si_{1-x}Ge_x$) included in a lower portion of the silicon germanium pattern 20PL near the first semiconductor layer 11 is larger than that of $Si_{1-x}Ge_x$ included in an upper portion of the silicon germanium pattern 20PU near the second semiconductor pattern 12P.

The substrate 10 for the BJT structure may be any suitable substrate, and may include a semiconducting material such as, for example, silicon (Si), germanium (Ge), silicon germanium (SiGe), silicon carbide (SiC), gallium nitride (GaN) or gallium arsenide (GaAs), a non-semiconducting material such as, for example, silicon oxide ($SiO_2$), aluminum (Al), aluminum oxide ($Al_2O_3$), ceramic, quartz, or copper (Cu), or any combination thereof, including multilayers, for example, germanium on silicon. The substrate 10 can include one or more semiconductor layers or structures and can include active or operable portions of semiconductor devices. For some applications, the substrate 10 may be a semiconductor substrate doped with impurities to render them P-type or N-type. In a p-doped silicon substrate, the Si substrate may be doped with P-type dopants such as, for example, boron (B), aluminum (Al), gallium (Ga) and indium (In). In an n-doped silicon substrate, the Si substrate may be doped with N-type dopants such as, for example, antimony (Sb), arsenic (As) and phosphorous (P). The preferable substrate material for the substrate 10 is silicon.

The plurality of vertical fins may each have a fin width in a range from about 10 nm to about 150 nm, a fin height in a range from about 20 nm to about 400 nm, and a fin pitch in a range from about 10 nm to about 200 nm. The first semiconductor layer 11 and the second semiconductor pattern 12P for the BJT structure may each individually include a group IV semiconductor such as, for example, silicon (Si), germanium (Ge), silicon germanium (SiGe), or silicon carbide (SiC), or a III-V semiconductor which includes at least one of group III elements of boron (B), gallium (Ga), aluminum (Al) and indium (In), and at least one of group V elements of nitrogen (N), phosphorus (P), arsenic (As), antimony (Sb) and bismuth (Bi). The first semiconductor layer 11 and the second semiconductor pattern 12P may include the same material, or may include different materials. The preferable material for both the first semiconductor layer 11 and the second semiconductor pattern 12P is Si. The first semiconductor layer 11 may be deposited on the substrate 10 or may be an extension of the substrate 10. The first semiconductor layer 11 and the second semiconductor pattern 12P may each be n-doped or p-doped with the dopant concentration in a range from about $1\times10^{20}$ to about $8\times10^{20}$/$cm^3$, although lesser and greater concentration may also be employed. The silicon germanium pattern 20P for the BJT structure may include silicon germanium ($Si_{1-x}Ge_x$) with a Ge mole fraction x in a range from about 0.03 to about 0.2 in the upper portion of the silicon germanium pattern 20PU, and in a range higher than about 0.2 in the lower portion of the silicon germanium pattern 20PL. The gradient is created in such a way that the silicon germanium pattern 20P in the lower portion near the first semiconductor layer 11 has high Ge content, and then the Ge content of the silicon germanium pattern 20P gradually decreases toward the upper portion. In an exemplary embodiment of the present invention, the silicon germanium pattern 20P for the BJT structure may include silicon germanium ($Si_{1-x}Ge_x$) with a Ge mole fraction x in a range higher than 0.3 or 0.5 in the lower portion of the silicon germanium pattern 20PL. The height of the silicon germanium pattern 20P may be in a range from about 10 nm to about 200 nm, for example, may be in a range from about 30 nm to about 150 nm. The height of the second semiconductor pattern 12P may be in a range from about 10 nm to about 200 nm, for example, may be in a range from about 30 nm to about 150 nm. The first semiconductor layer 11 and the second semiconductor pattern 12P may each individually include an n-doped semiconductor and the silicon germanium pattern 20P may include p-doped silicon germanium. Alternatively, the first semiconductor layer 11 and the second semiconductor pattern 12P may each individually include a p-doped semiconductor and the silicon germanium pattern 20P may include n-doped silicon germanium. If any of the first semiconductor layer 11 and the second semiconductor pattern 12P includes III-V semiconductor, the amount of p-type or n-type dopant that may be present may be in a range from about $1\times10^{18}$ to about $1\times10^{21}$/$cm^3$, although lesser and greater concentration may also be employed. The p-type dopant for III-V semiconductor may be, for example, zinc (Zn), beryllium (Be), cadmium (Cd) or magnesium (Mg). The n-type dopant for III-V semiconductor may be, for example, silicon (Si), tin (Sn), sulfur (S), or selenium (Se).

Spacers (the second spacers 32 described above) for the BJT structure may be formed on sidewalls of the plurality of vertical fins. The material for the spacers 32 may include silicon oxide ($SiO_2$), silicon nitride ($Si_3N_4$), titanium nitride (TiN), boron nitride (BN), amorphous carbon (a-C), metal, and/or metal oxide, and may have a thickness ranging from about 4 nm to about 20 nm and should be proportional to the size of the feature intended to be patterned. Preferably, the material for the spacers 32 is silicon nitride.

The dielectric material 51 for the BJT structure may be formed to isolate the plurality of vertical fins. The dielectric material 51 may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluorethylene or PTFE), silicon oxyfluoride (FSG), carbon doped $SiO_2$ (SiCO), hydrogenated silicon oxycarbide (SiCOH), or other low k dielectric materials. The preferable material for the dielectric material 51 is $SiO_2$.

The emitter contacts 71, the base contacts 72 and the collector contacts 73 may be formed to connect to the second semiconductor patterns 12P, the silicon germanium patterns 20P and the first semiconductor layer 11, respectively, in the dielectric material 51, and may each include one or more conductive materials. The conductive material may include an n-type work function metal such as, for example, titanium (Ti), aluminum (Al), titanium aluminide (TiAl), titanium aluminum nitride (TiAlN), tantalum carbide (TaC), niobium (Nb) or the like, or may include a p-type work function metal such as, for example, titanium nitride (TiN), tungsten nitride (WN), tantalum nitride (TaN) and ruthenium (Ru) or the like for NPN or PNP BJTs. Alternatively, the conductive material may include a metal, for example, gold (Au), titanium (Ti), copper (Cu), silver (Ag), Aluminum (Al), tungsten (W), cobalt (Co), Chromium (Cr), molybdenum (Mo), zirconium (Zr), nickel (Ni), tantalum (Ta), platinum (Pt), or an alloy thereof. The emitter contacts 71, the base contacts 72 and the collector contacts 73 may each be formed as multilayers, for example, Ni/Ti/Al, Ni/Au, Ti/Al, Ti/Al/Ni/Au or the like. The emitter contacts 71 may each be a rectangle shape extending in the first direction (X direction) across the plurality of vertical fins, connected to the second semiconductor patterns 12P, and having a height in the third direction (Z direction) smaller than the height of the second semiconductor patterns 12P. The second semiconductor patterns may function as the emitters for the BJT structure. The base contacts 72 may each be a rectangle shape extending in the first direction (X direction) across the end portions of the plurality of vertical fins, connected to the silicon germanium patterns 20P, and having a depth in the third direction (Z direction) in the dielectric material 51 sufficient deep to reach the top surface of the silicon germanium patterns 20P. The silicon germanium patterns 20P may function as the bases of the BJT structure. The collector contacts 73 may each be a rectangle shape extending in the second direction (Y direction) parallel to the plurality of vertical fins, connected to the first semiconductor layer 11, and having a depth in the third direction (Z direction) in the dielectric material 51 sufficient deep to reach the top surface of the first semiconductor layer 11. The first semiconductor layer 11 may function as the collector of the BJT structure. Although the emitter contacts 71, the base contacts 72 and the collector contacts 73 are shown as rectangular shape, the present invention is not limited thereto. Depending on the desired device structure, other shapes besides rectangle shape may also be used. For example, the shape of the emitter contacts 71, the base contacts 72 and the collector contacts 73 may each individually be circle, square, triangle, trapezoid, rhombus, oval, hexagon, or any other suitable shapes. The base contacts 72 and the collector contacts 73 may further include spacers (the third spacers 33 and the fourth spacers 34 described above) on their sidewalls.

Referring to FIGS. 14A and 14B, FIG. 14A is a schematic top-view diagram representing emitter contacts 71, base contacts 72 and collector contacts 73 formed to connect to the second semiconductor patterns 12P, the silicon germanium patterns 20P and the first semiconductor layer 11, respectively, in the dielectric material 51, in which the germanium content is higher in the outer portions of the silicon germanium patterns 20PO, and FIG. 14B is a schematic cross-sectional diagram of FIG. 14A taken along line A-A' according to an exemplary embodiment of the present invention. According to an exemplary embodiment of the present invention, there is provided a BJT structure including: a first semiconductor layer 11 disposed on a substrate 10; a plurality of vertical fins disposed on the first semiconductor layer 11, spaced apart in a first direction and extending in a second direction crossing the first direction, each of the plurality of vertical fins vertically protruding in a third direction perpendicular to the first and second directions, and including a silicon germanium pattern 20P and a second semiconductor pattern 12P sequentially stacked on the first semiconductor layer 11; a dielectric material 51 formed over the first semiconductor layer 11 to fill all spaces among the plurality of vertical fins; and an emitter contact 71, a base contact 72 and a collector contact 73 formed within the dielectric material 51 to connect to the second semiconductor pattern 12P, the silicon germanium pattern 20P and the first semiconductor layer 11, respectively, in which a germanium mole fraction x of silicon germanium ($Si_{1-x}Ge_x$) included in outer portions near sidewalls of the silicon germanium pattern 20PO is larger than that of $Si_{1-x}Ge_x$ included in an inner portion of the silicon germanium pattern 20PI.

The silicon germanium pattern 20P for the BJT structure may include silicon germanium ($Si_{1-x}Ge_x$) with a Ge mole fraction x in a range from about 0.03 to about 0.2 in the inner portion of the silicon germanium pattern 20PI, and in a range higher than about 0.2 in the outer portion of the silicon germanium pattern 20PL. The gradient is created in such a way that the silicon germanium pattern 20P in the outer portion near the sidewalls has high Ge content, and then the Ge content of the silicon germanium pattern 20P gradually decreases toward the inner portion. In an exemplary embodiment of the present invention, the silicon germanium pattern 20P for the BJT structure may include silicon germanium ($Si_{1-x}Ge_x$) with a Ge mole fraction x in a range higher than 0.3 or 0.5 in the outer portion of the silicon germanium pattern 20PL. The germanium mole fraction x of $Si_{1-x}Ge_x$ included at or close to the sidewalls of the silicon germanium pattern 20P may be about 1.0.

As described above, exemplary embodiments of the present invention provide a method of forming the high Ge content SiGe base and/or the gradient SiGe base in the BJT structure through coating the $GeO_2$ layer(s) and low temperature condensation annealing(s), so that the SiGe base would be defect free, and would alleviate high temperature damage caused by conventional Ge condensation process, and also provide BJT structures having the high Ge content SiGe base and/or the gradient SiGe base.

Although illustrative embodiments of the present invention have been described in detail, it should be understood that the present invention is not intended to be limited to the specific embodiments disclosed. Based on the foregoing disclosure, those skilled in the art will be able to make various changes, substitutions and alterations without departing from the spirit and scope of the present invention as defined by the following appended claims.

What is claimed is:

1. A bipolar junction transistor (BJT) structure comprising:
   a first semiconductor layer disposed on a substrate;
   a plurality of vertical fins disposed on the first semiconductor layer, spaced apart in a first direction and extending in a second direction crossing the first direction, each of the plurality of vertical fins vertically protruding in a third direction perpendicular to the first and second directions, and comprising a silicon germanium pattern and a second semiconductor pattern sequentially stacked on the first semiconductor layer;

a dielectric material formed over the first semiconductor layer to fill all spaces among the plurality of vertical fins; and an emitter contact, a base contact and a collector contact formed within the dielectric material to connect to the second semiconductor pattern, the silicon germanium pattern and the first semiconductor layer, respectively, wherein a germanium mole fraction x of silicon germanium ($Si_{1-x}Ge_x$) included in a lower portion of the silicon germanium pattern near the first semiconductor layer is larger than that of $Si_{1-x}Ge_x$ included in an upper portion of the silicon germanium pattern near the second semiconductor pattern.

2. The BJT structure of claim 1, wherein each of the plurality of vertical fins further comprises spacers formed on its sidewalls.

3. The BJT structure of claim 1, wherein the first semiconductor layer comprises a first semiconductor, the second semiconductor pattern comprises a second semiconductor, and the first semiconductor and the second semiconductor are the same.

4. The BJT structure of claim 1, wherein the first semiconductor layer and the second semiconductor pattern each individually comprises an n-doped semiconductor and the silicon germanium pattern comprises p-doped silicon germanium, or the first semiconductor layer and the second semiconductor pattern each individually comprises a p-doped semiconductor and the silicon germanium pattern comprises n-doped silicon germanium.

5. The BJT structure of claim 1, wherein the germanium mole fraction x of $Si_{1-x}Ge_x$ included in the upper portion of the silicon germanium pattern is in a range from about 0.03 to about 0.2.

6. A bipolar junction transistor (BJT) structure comprising:

a first semiconductor layer disposed on a substrate;

a plurality of vertical fins disposed on the first semiconductor layer, spaced apart in a first direction and extending in a second direction crossing the first direction, each of the plurality of vertical fins vertically protruding in a third direction perpendicular to the first and second directions, and comprising a silicon germanium pattern and a second semiconductor pattern sequentially stacked on the first semiconductor layer;

a dielectric material formed over the first semiconductor layer to fill all spaces among the plurality of vertical fins; and an emitter contact, a base contact and a collector contact formed within the dielectric material to connect to the second semiconductor pattern, the silicon germanium pattern and the first semiconductor layer, respectively, wherein a germanium mole fraction x of silicon germanium ($Si_{1-x}Ge_x$) included in outer portions near sidewalls of the silicon germanium pattern is larger than that of $Si_{1-x}Ge_x$ included in an inner portion of the silicon germanium pattern.

7. The BJT structure of claim 6, wherein the first semiconductor layer and the second semiconductor pattern each individually comprises an n-doped semiconductor and the silicon germanium pattern comprises p-doped silicon germanium, or the first semiconductor layer and the second semiconductor pattern each individually comprises a p-doped semiconductor and the silicon germanium pattern comprises n-doped silicon germanium.

8. The BJT structure of claim 6, wherein the germanium mole fraction x of $Si_{1-x}Ge_x$ included in the inner portion of the silicon germanium pattern is in a range from about 0.03 to about 0.2.

* * * * *